(12) United States Patent
Nishibayashi

(10) Patent No.: US 6,875,283 B2
(45) Date of Patent: Apr. 5, 2005

(54) FILM FORMING APPARATUS AND FILM FORMING METHOD

(75) Inventor: Takahiro Nishibayashi, Kumamoto-ken (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/440,120

(22) Filed: May 19, 2003

(65) Prior Publication Data

US 2003/0215573 A1 Nov. 20, 2003

(30) Foreign Application Priority Data

May 20, 2002 (JP) ........................................ 2002-145239

(51) Int. Cl.[7] ................ C23C 16/52; C23C 16/00; B05C 11/00
(52) U.S. Cl. ................ 118/725; 118/58; 118/663; 118/665; 118/692; 118/712; 118/725
(58) Field of Search ................ 118/58, 663, 665, 118/692, 708, 712, 715, 725

(56) References Cited

U.S. PATENT DOCUMENTS

| | | | | |
|---|---|---|---|---|
| 4,814,690 A | * | 3/1989 | Melcher et al. | 324/674 |
| 5,565,034 A | * | 10/1996 | Nanbu et al. | 118/668 |
| 5,626,675 A | * | 5/1997 | Sakamoto et al. | 118/663 |
| 5,766,671 A | * | 6/1998 | Matsui | 427/8 |
| 5,817,156 A | * | 10/1998 | Tateyama et al. | 29/25.01 |
| 5,908,657 A | * | 6/1999 | Kimura et al. | 427/9 |
| 5,939,130 A | * | 8/1999 | Shiraishi et al. | 427/9 |
| 6,002,109 A | * | 12/1999 | Johnsgard et al. | 219/390 |
| 6,027,760 A | * | 2/2000 | Gurer et al. | 427/8 |
| 6,043,460 A | * | 3/2000 | Johnsgard et al. | 219/390 |
| 6,077,350 A | * | 6/2000 | Morton et al. | 118/58 |
| 6,129,546 A | * | 10/2000 | Sada | 432/253 |
| 6,190,459 B1 | * | 2/2001 | Takeshita et al. | 118/715 |
| 6,409,838 B1 | | 6/2002 | Sakai | |
| 6,413,317 B1 | * | 7/2002 | Miyazaki et al. | 118/620 |
| 6,416,583 B1 | * | 7/2002 | Kitano et al. | 118/680 |
| 6,573,031 B2 | * | 6/2003 | Shinya et al. | 430/325 |
| 2002/0142493 A1 | * | 10/2002 | Halliyal et al. | 438/14 |
| 2003/0044531 A1 | * | 3/2003 | Ishida | 427/240 |
| 2003/0145791 A1 | * | 8/2003 | Shinya et al. | 118/724 |
| 2003/0215573 A1 | * | 11/2003 | Nishibayashi | 427/379 |
| 2004/0096586 A1 | * | 5/2004 | Schulberg et al. | 427/372.2 |

FOREIGN PATENT DOCUMENTS

| | | | |
|---|---|---|---|
| JP | 63-262842 A | * | 10/1988 |
| JP | 03-006811 A | * | 1/1991 |
| JP | 11-214658 A | | 8/1999 |

OTHER PUBLICATIONS

Japanese Office Action mailed Nov. 2, 2004.

* cited by examiner

Primary Examiner—Jeffrie R. Lund
(74) Attorney, Agent, or Firm—Rader, Fishman & Grauer PLLC

(57) ABSTRACT

Coating an insulating film on a substrate, heating the substrate at a pressure higher than an atmospheric pressure in a chamber, followed by the curing process performed at a pressure lower than the atmospheric pressure in a separate chamber. With this process, the desorption of the porogen from the insulating film during heating can be restrained therefore an insulating film of high quality can be formed.

7 Claims, 18 Drawing Sheets

FILM FORMING APPARATUS AND FILM FORMING METHOD

BACKGROUND OF THE INVENTION

1. Field of the Invention

The present invention relates to a film forming method and a film forming apparatus that forms an insulating film onto a semiconductor wafer in manufacturing semiconductor devices.

2. Description of the Related Art

When a semiconductor device is produced, an inter-layer insulating film is formed by, for example, an SOD (Spin on Dielectric) system. In the SOD system, a coating film is spin-coated on a semiconductor wafer (hereinafter referred to as a "wafer") and an inter-layer insulating film is formed by performing processes like a physical or a chemical process such as baking and the like.

In a baking process, the process is performed stepwise under an environment according to the purpose. For example, in the first baking process, solvents like thinner, and the like, contained in the insulating film is cause to evaporate, then, by performing the second baking process at a higher temperature than the first baking process, the molecular frame of the insulating film is formed. In the end, the insulating film is burned to harden by "curing process" (hardening process), and the process of forming the insulating film is completed.

Incidentally, in the second baking process, for example, the wafer is heated at a temperature of less than 200° C. in an atmosphere of low oxygen concentration created by reducing pressure from the atmospheric pressure, so that the oxidation of the wafer is restrained while forming a frame of the insulating film. However, even under such atmospheric circumstance there are some cases that the oxidation may occur caused by desorption of a "porogen" in the insulating film. Here, "porogen" is a volatile substance used to cause the insulating film to be porous. As explained, if the wafer is oxidized in the second baking process, the curing process is to be performed without forming a frame of the insulating film in a good condition, therefore, formation of an insulating film of high quality becomes difficult.

In other words, primarily the stepwise heating process is aimed to forming the frame without oxidizing thereof in the second baking process, then accelerates the oxidation in the second baking process and forming an insulating film of high quality in the curing process. However the problem is that during the second baking process, desorption of the porogen from the insulating film occurs causing the oxidation of the film. As a result, there is a problem that porosity of the insulating film formed with the curing process becomes, for example, 70% or lower, therefore, the insulating film cannot be formed in a desired low dielectric constant.

SUMMARY OF THE INVENTION

Considering the above-described circumstances, an object of the present invention is to provide a film forming method and a film forming apparatus that can perform appropriate heating process to the insulating film on the wafer at each stage of, for example, forming the molecular frame of the insulating film, performing a hardening process for the insulating film etc. so that the insulating film of high quality can be formed.

In order to achieve the above-mentioned objective, the film forming method of the present invention, comprises (a) coating an insulating film on a substrate, (b) heating the substrate coated with the insulating film at a first temperature and at a first pressure higher than an atmospheric pressure, and (c) heating the substrate at a second temperature and at a second pressure lower than the atmospheric pressure after the step (b).

Conventionally, oxidation is restrained by creating a low oxygen atmosphere by having a pressure lower than the atmospheric pressure. In contrast, in the present invention, heating process is performed at a higher pressure than the atmospheric pressure. In this manner, the desorption of the porogen from the insulating film can be restrained therefore a molecular frame can be formed in a good condition. As a result, insulating film of a high quality can be formed by "burning to harden" the insulating film in the curing process performed thereafter. Here, "porogen" is a volatile substance used to cause the insulating film to be porous and the oxidation is accelerated by the desorption of the porogen from the insulating film. In addition, as a material used to form an insulating film, a porous type material containing, for example, "porogen" with which a film of low dielectric constant can be achieved by having the porogen disappear during the process forming thereof. Especially the porous material is preferred to be at least one of ALCAP, porous SiLK and CCIC. In addition, the first heating process is preferable to be performed at 100 kPa to 200 kPa.

Moreover, in the present invention, the second heating process is performed at a pressure lower than the atmospheric pressure which accelerates desorption of the porogen, in other words, oxidation is accelerated and the insulating film of high quality can be formed. The second heating process is preferable to be performed at 100 Pa to 100 kPa. Furthermore, having the second temperature higher than the first temperature when performing the curing process contributes to accelerate oxidation.

In an embodiment of the present invention, the insulating film is coated in an atmosphere containing a component of an insulating film material. By performing a first heating process in the atmosphere containing the same component as the insulating film as in this manner, the desorption of the porogen from the insulating film can be restrained, so as the oxidation.

In another embodiment of the present invention the step (b) has (d) heating the substrate at a first temperature, and (e) heating the substrate at a second temperature higher than the first temperature, and the method further-comprises, (f) measuring a concentration of a solvent evaporated while heating the insulating film in the step (d) and (g) controlling the heating of the substrate in the step (f) so that the step (e) is terminated after the concentration of the solvent measured in the step (g) reaches a predetermined value and heat the substrate in the step (e) for a predetermined time period.

Heating at a first temperature enables the solvent in the insulating film to evaporate. When the solvent in the insulating film decreases, the concentration of the evaporating solvent decreases as well. According to the present invention, for example, measuring the concentration enables the process to be controlled so that the first heating process is completed when the concentration is decreased to the predetermined value, assuming that all the solvent contained in the insulating film has evaporated. The predetermined value can be set, for example, by previously measuring the concentration of the solvent at a time when all of the solvent contained in the insulating film has evaporated. In the step of heating at a second temperature, the time taken for the formation of the molecular frame of the insulating film is measured beforehand, and the heating can be stopped based on the measured time period. With this configuration, heating process at each stage can be performed more effectively.

According to another embodiment of the present invention the method comprises, (h) measuring an amount of the porogen evaporated from the insulating film heated in the step (c) and (i) controlling the heating of the substrate so that the step (c) is terminated after the amount of the porogen measured in the step (h) reached a predetermined value.

In the second heating process, the insulating film is "burned to harden" while having the porogen in the insulating film evaporate. When the porogen in the insulating film decreases, the amount of evaporating porogen decreases as well. In the present invention, for example, the heating can be controlled so that it stops when the amount of evaporated porogen decreases to a predetermined value by measuring the amount of the porogen assuming that all the porogen contained in the insulating film has evaporated. The predetermined value can be set corresponding to a value obtained from previously measuring the amount of evaporated porogen at a time when all the porogen contained in the insulating film has evaporated. In this manner, the heating process can be performed more effectively.

Another embodiment of the present invention, the method comprises, between the step (a) and the step (b), (k) causing a plurality of pins for holding the substrate to hold the substrate, (l) controlling a pressure on the substrate to become the first pressure while having the plurality of pins hold the substrate, and (m) lowering the plurality of pins after the step (l) so that the substrate is placed on a heating plate for heating the substrate.

When the substrate is heated before the pressure exerted on the substrate became higher than the atmospheric pressure, for example, the pressure is controlled while heating the substrate, the substrate is to be heated before the pressure reaches a predetermined value. Therefore, at the time when heating is started, desorption of the porogen occurs since the pressure exerted on the wafer is insufficient. According to the configuration of the present invention, the substrate can be kept unheated while being held by the plurality of pins that are moved up above the heating plate until the pressure exerted on the substrate reaches a predetermined value. And the substrate can be heated after the pressure thereon reached higher than the atmospheric pressure, therefore, the desorption of the porogen can be restrained without fail and the insulating film of high quality can be formed.

To the contrary, when the substrate is heated before the pressure exerted on the substrate became lower than the atmospheric pressure, for example, the pressure is adjusted in the same time as a start of heating substrate, the substrate is to be heated before the pressure becomes the predetermined value. Therefore, at the time when the heating is started, desorption of the porogen is restrained due to the excess pressure exerted on the substrate. Therefore according to the configuration of the present invention, the substrate can be kept unheated while being held by the plurality of pins that are moved up above the heating plate until the pressure exerted on the substrate reaches the predetermined value. And the substrate can be heated after the pressure thereon reached lower than the atmospheric pressure, therefore, the desorption of the porogen can be accelerated without fail and the insulating film of high quality can be formed.

The second embodiment of the film forming method comprises, (a) heating a substrate coated with an insulating film containing a porogen at a first temperature and at a first pressure higher than an atmospheric pressure, (b) heating the substrate at the first pressure and at a second temperature higher the first temperature after the step (a), and (c) heating the substrate at a second pressure lower than the atmospheric pressure.

In the present invention, the solvent contained in the insulating film can be evaporated while restraining the desorption of the porogen in the same time by heating the substrate at a pressure higher than the atmospheric pressure. In addition, in the second heating process, the molecular frame of the insulating film can be formed while restraining the desorption of the porogen. With this structure, the desorption of the porogen from the insulating film can be restrained, therefore, a molecular frame can be formed in a good condition. Moreover, in the third heating process, the heating process is performed at a pressure lower than the atmospheric pressure, which accelerates the desorption of the porogen, in other words, oxidation can also be accelerated. As a result, insulating film of a high quality can be formed by "burning to harden" the insulating film as having the porogen desorb in the same time.

The third embodiment of the film forming method comprises, (a) heating a substrate coated with an insulating film at a first pressure higher than an atmospheric pressure, (b) heating the substrate at a second pressure lower than the atmospheric pressure after the step (a), (c) measuring a film thickness of the insulating film in at least one of the step (a) and the step (b), (d) inferring a relative permittivity of the insulating film corresponding to a value of the film thickness measured in the step (c), and (e) controlling at least one of the first pressure in the step (a) and the second pressure in the step (b) corresponding to a value of the relative permittivity inferred in the step (d).

In the present invention, in the first heating process, the molecular frame of the insulating film can be formed while having the solvent evaporate and the desorption of the porogen restrained. In addition, in the second heating process, the insulating film is burned to harden while having the porogen evaporate. In the heating step, the film thickness of the insulating film varies depending on the pressure during heating. According to the present invention, measuring a film thickness of the insulating film that varies during the heating of the substrate enables to infer the relative permittivity of the insulating film and a pressure exerted on the substrate can be controlled corresponding to the inferred relative permittivity. The controlling process described-above can be performed during the heating process.

The film thickness of the insulating film and the relative permittivity are correlated with each other. It is possible to estimate the relative permittivity when the film thickness of the insulating film is known. Therefore, by calculating the correlation between the film thickness and the relative permittivity beforehand, the pressure can be controlled based on the correlation. By controlling the pressure, the relative permittivity of the insulating film can become closer to the predetermined value. The desired value may correspond with a value measured, for example, by an electrical measuring method. With this configuration, the pressure can be optimized while heating and the process can be performed effectively. Furthermore, the film thickness of the insulating film can be controlled, therefore, the insulating film of high quality with desired relative permittivity can be obtained.

The fourth embodiment of the film forming method comprises, (a) heating a substrate coated with an insulating film containing a porogen at a first temperature, and at a first pressure higher than an atmospheric pressure so that a solvent contained in the insulating film evaporates, (b) measuring a concentration of the solvent evaporated in the heating process in the step (a), (c) heating the substrate at a second temperature higher than the first temperature for a predetermined time period after the concentration of the solvent measured in the step (b) reached a predetermined value, (d) heating the substrate at a second pressure lower than the atmospheric pressure so that a porogen contained in the insulating film evaporates, (e) measuring an amount of the porogen evaporated in the step (d), and (f) terminating the step (d) when the amount of porogen measured in the step (e) reached a predetermined value.

In the present invention, in the first heating process, by heating at a pressure higher than the atmospheric pressure, the solvent contained in the insulating film can be evaporated while restraining the desorption of the porogen. When the solvent in the insulating film decreases, the concentration of the evaporating solvent decreases as well. Measuring the concentration enables the process to be controlled so that the first heating process is completed when the concentration is decreased to the predetermined value, assuming that all the solvent contained in the insulating film has evaporated. The predetermined value can be set, for example, by measuring the amount evaporated based on the measured concentration amount of evaporation of the porogen in the insulating film.

In the second heating process, by heating at a pressure higher than the atmospheric pressure, the molecular frame of the insulating film can be formed while restraining the desorption of the porogen. Moreover, the time taken for the formation of the molecular frame of the insulating film is measured beforehand, the heating can be stopped based on the measured time period.

In the third heating process, the insulating film can be "burned to harden" while having the porogen in the insulating film evaporate. When the porogen in the insulating film decreases, the amount of evaporating porogen decreases as well. Measuring the amount of porogen enables to control heating so that the heating is terminated when the amount of evaporated porogen decreases to a predetermined value, assuming that all the porogen contained in the insulating film has evaporated. The predetermined value can be set by previously measuring the amount of evaporation of the porogen in the insulating film. With this configuration, heating process at each stage can be performed more effectively and an insulating film of high quality can be formed.

The first embodiment of a film forming apparatus of the present invention comprises, a coating process portion for coating an insulating film containing a porogen on a substrate, a first heating process portion having a first processing chamber capable of being hermetically sealed, for performing a first heating process for the substrate coated with the insulating film at a first pressure higher than an atmospheric pressure and at a first temperature, and performing a second heating process at the first pressure and -at a second temperature higher than the first temperature, and a second heating process portion having a second processing chamber capable of being hermetically sealed, for performing a third heating process at a second pressure lower than the atmospheric pressure on the substrate heated in the first heating process portion.

According to the present invention, heating at a pressure higher than the atmospheric pressure enables the solvent contained in the insulating film to evaporate while restraining the desorption of the porogen in the same time. In addition, in the second heating process, the molecular frame of the insulating film can be formed while restraining the desorption of the porogen. With this structure, the desorption of the porogen from the insulating film can be restrained, therefore, a molecular frame can be formed in a good condition. Moreover, in the third heating process, the heating process is performed at a pressure lower than the atmospheric pressure, which accelerates the desorption of the porogen, in other words, oxidation can be accelerated. As a result, insulating film can be "burned to harden" while having the porogen desorb in the same time. As a result, the insulating film of high quality can be formed.

Another embodiment of the present invention has a controller for controlling the first pressure to be 100 kPa to 200 kPa. Controlling the first pressure to be in the above mentioned range enables to restrain the desorption of the porogen without fail.

The present invention further comprises, a gas supplying portion supplying a gas containing a component of an insulating film material into the first processing chamber. In such manner, performing a first heating process in the atmosphere containing the same component as the insulating film enables to restrain the desorption of the progen from the insulating film.

An embodiment of the present invention comprises, a first measuring portion measuring a concentration of the solvent evaporated in the heating process, and means for controlling the first heating process portion so that the first heating process is terminated and the second heating process is started after the measured concentration of the solvent reached a predetermined value. The first heating process is performed to have the solvent in the insulating film evaporate. When the solvent in the insulating film decreases, the concentration of the evaporated solvent decreases as well. In the present invention, providing the first measuring portion and the controlling enables the first heating process to be terminated and the second heating process to be started-when the amount of evaporated porogen decreases to a predetermined value, assuming that all the porogen contained in the insulating film has evaporated. The predetermined value can be set, for example, by previously measuring the concentration of the solvent at a time when all of the solvent contained in the insulating film has evaporated.

Another embodiment of the present invention comprises, a second measuring portion for measuring an amount of the porogen evaporated in the third heating process and means for controlling the second heating process portion so that the third heating process is terminated after the measured amount of the porogen reached a predetermined value. In the third heating process, the insulating film is burned to harden while having the porogen in the insulating film evaporate. When the porogen in the insulating film decreases, the amount of evaporating porogen decreases as well. Providing the second measuring portion and the controlling means enables to control the third heating process so that the third heating process is terminated when the amount of evaporated porogen decreases to a predetermined value, assuming that all the porogen contained in the insulating film has evaporated. The predetermined value can be set corresponding to a value obtained from previously measuring the amount of evaporated porogen at a time when all the porogen contained in the insulating film has evaporated. In this manner, the heating process can be performed more effectively.

Another embodiment of the present invention comprises, means for measuring a film thickness of the insulating film in at least one of the first heating process portion and the second heating process portion, means for inferring a relative permittivity of the insulating film corresponding to a value of the measured film thickness and means for controlling at least one of the first pressure and the second pressure corresponding to the inferred value of the permittivity.

The film thickness of the insulating film varies depending on the pressure during heating. The film thickness of the insulating film and the relative permittivity are correlated with each other. It is possible to estimate the relative permittivity if the film thickness of the insulating film becomes known. Therefore, by knowing the correlation between the film thickness and the relative permittivity beforehand, the pressure can be controlled corresponding with the correlation. By controlling the pressure, an insulating film having a relative permittivity of a desired value can be formed. The desired value of the relative permittivity may be based on a value measured previously, for example, by using an electric measuring method. According to the present invention, measuring a film thickness of the insulating film that varies during the heating of the substrate enables to infer the relative permittivity of the insulating film, and a pressure exerted on the substrate can be controlled corresponding to the inferred relative permittivity. With this configuration, the pressure can be optimized while heating, the process can be performed effectively and an insulating film of high quality can be formed.

Another embodiment of the present invention comprises, a heating plate provided inside the first processing chamber for placing and heating the substrate, a plurality of pins, capable of placing the substrate on the heating plate by moving up and down against the heating plate, first controlling means controlling the plurality of pins to hold the substrate above the heating plate until a pressure inside the first processing chamber reaches the first pressure and to cause the plurality of pins to move down below the heating plate after the pressure inside the first processing chamber reaches the first pressure, so that the substrate is placed on the heating plate, and second controlling means for controlling the plurality of pins to hold the substrate above the heating plate until the pressure inside the first processing chamber reaches the second pressure and to cause the plurality of pins to move down below the heating plate after the pressure inside the first processing chamber reaches the second pressure, so that the substrate is placed on the heating plate.

When the first heating process is performed before the pressure inside the chamber becomes lower than the first pressure, for example, in a case where the pressure is regulated while heating, the wafer is heated before the pressure reaches to a predetermined value. Therefore, at the time when heating is started, desorption of the porogen occurs since the pressure exerted on the wafer is insufficient. Similarly, when the second heating process is started before the second pressure in the first heating process portion becomes the value of the second pressure, the desorption of the porogen occurs since the pressure exerted on the substrate in the heating process is insufficient. According to the present invention, the first heating process is performed after the pressure inside the first heating process portion became the second pressure, therefore, the desorption of the porogen can be restrained without fail and the insulating film of good quality can be formed.

Another embodiment of the present invention comprises, a heating plate provided inside the second processing chamber for placing and heating the substrate, a plurality of pins, capable of moving up and down against the heating plate while holding the substrate and placing the substrate on the heating plate and means for controlling the plurality of pins to hold the substrate above the heating plate until the pressure inside the second processing chamber reaches the second pressure and moves down below the heating plate after the pressure inside the second processing chamber reaches the second pressure, so that the substrate is placed on the heating plate.

On the contrary, when the third heating process is performed before the pressure inside the chamber becomes lower than the atmospheric pressure, for example, in a case where the pressure is controlled while heating, the wafer is heated before the pressure reaches to a -predetermined value. According to a configuration of the present invention, the third heating process is performed after the pressure in the second heating process portion becomes lower than the atmospheric pressure, therefore, the desorption of the porogen is accelerated without fail and the insulating film of high quality can be formed.

These and other objects, features and advantages of the present invention will become more apparent in light of the following detailed description of a best mode embodiment thereof, as illustrated in the accompanying drawings.

DETAILED DESCRIPTION OF THE PREFERRED EMBODIMENT

Figure 1:
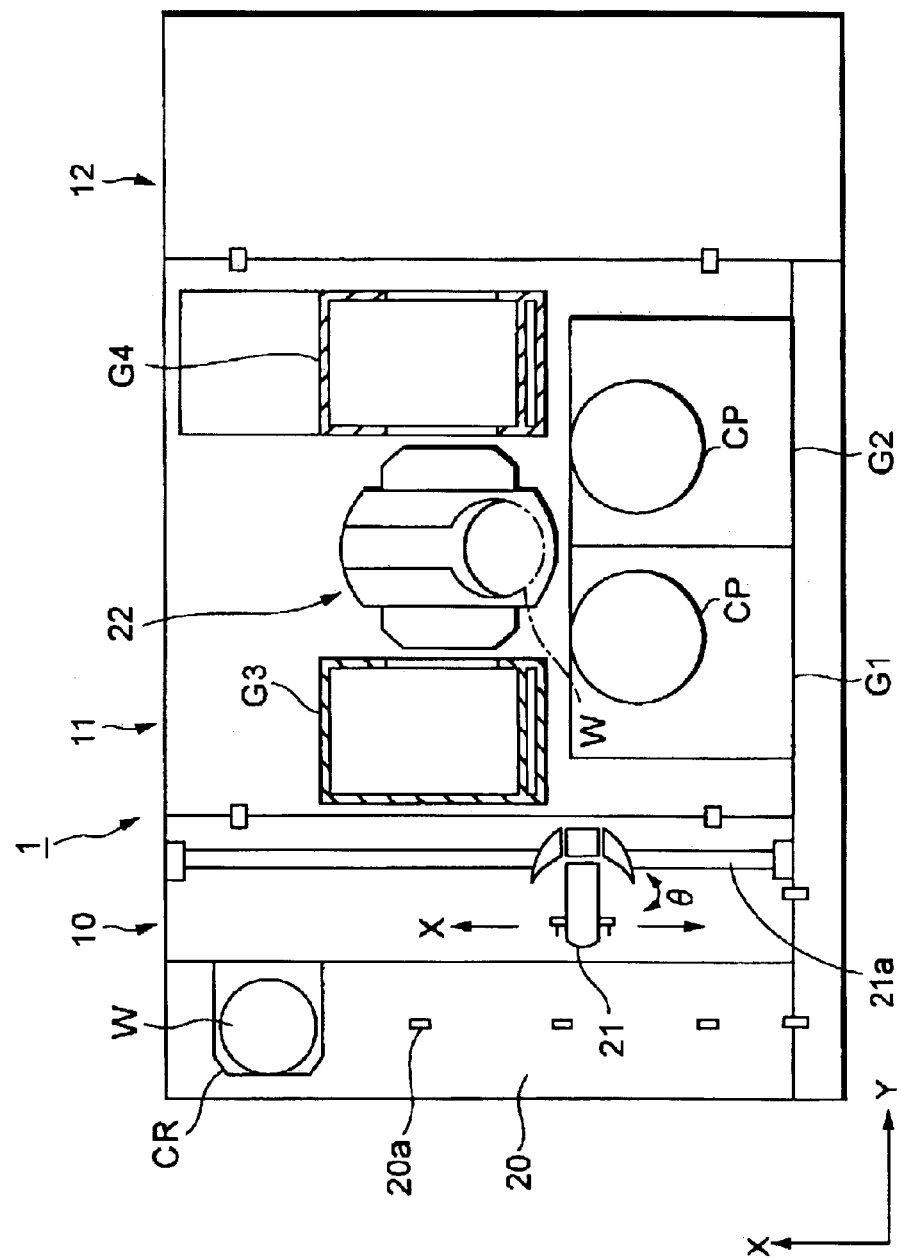
FIG. 1 is a plan view of the SOD system applied to the present invention.
Figure 2:
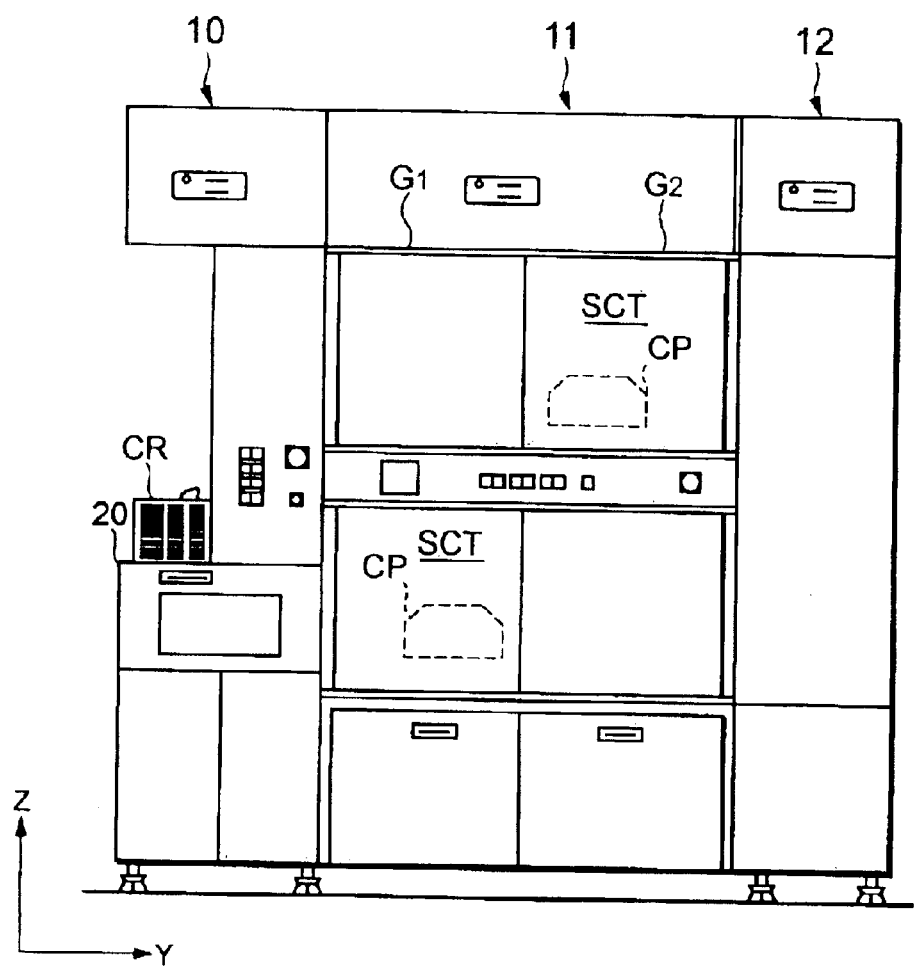
FIG. 2 is a front view of the SOD system shown in FIG. 1.
Figure 3:
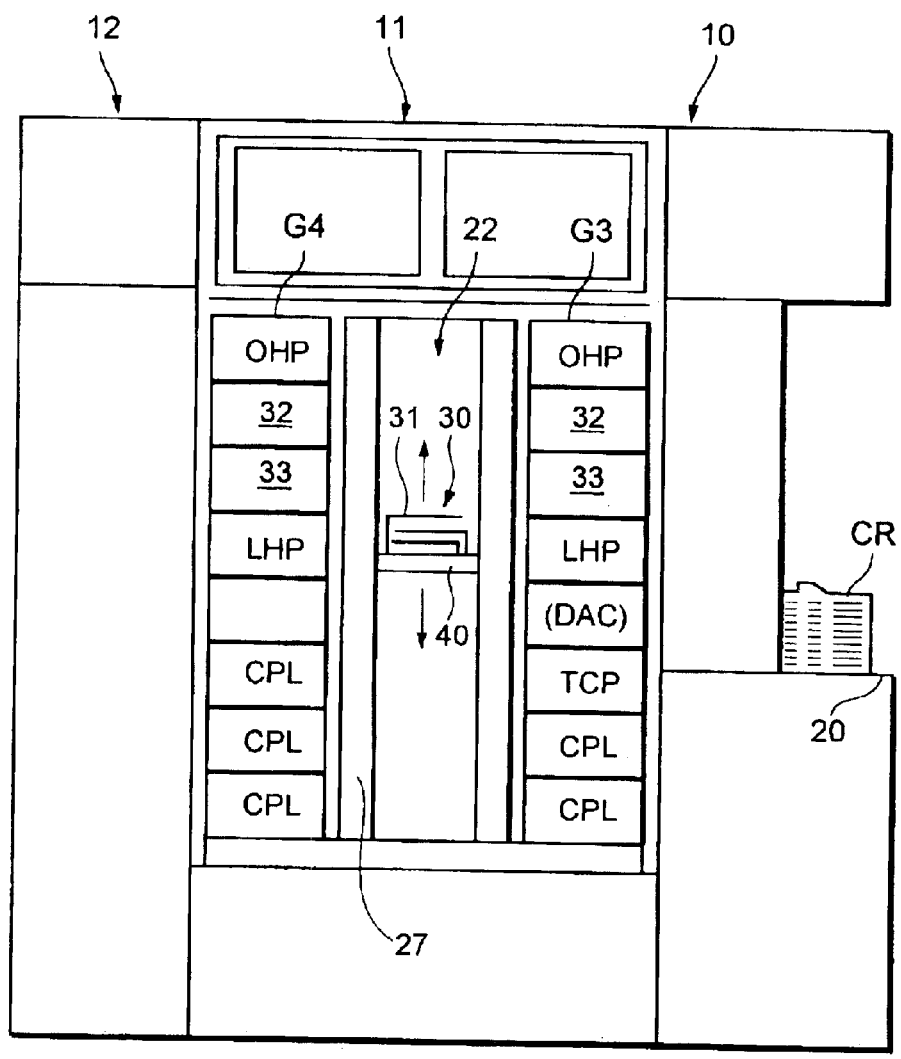
FIG. 3 is a rear view of the SOD system shown in FIG. 1.

FIG. 1, FIG. 2 and FIG. 3 are diagrams showing total configuration of a Spin on Dielectric system (SOD system) according to an embodiment of the present invention. FIG. 1 is a plan view, FIG. 2 is a front view, and FIG. 3 is a rear view.

The SOD system 1 has a configuration in which, a cassette block 10 for carrying a plurality of semiconductor wafer W, for example, 25 wafer Ws, as a unit and transferring the wafer Ws into and out of the system and also into and out of the wafer cassette CR, a processing block 11 composed of various kinds of processing units multi-tiered at predetermined positions for performing predetermined processing for the wafer Ws one by one in SOD application steps, are structured to be integrally connected.

In the cassette block 10, as shown in FIG. 1, a plurality of, for example, up to four cassettes CR are placed in a line of X-direction on the projections 20a on a cassette mounting table 20, with respective outlet and inlet ports for the wafer W facing the processing block 11. A wafer transfer mechanism 21 movable in the direction of arrangement of the cassettes (an X-direction) and in the direction of arrangement of the wafers housed in the wafer cassette CR (a Z-vertical direction) is structured to be selectively accessible to each of the wafer cassettes CR. Further, the wafer transfer mechanism 21 is structured so that it can be rotated in θ-direction so as to be accessible to a transfer and cooling plate (TCP) is included in a multi-tiered station portion of a third unit group G3 disposed at the processing block 11 side, as will be described later.

In the processing block 11, as shown in FIG. 1, a vertical carrier type of a main wafer transfer mechanism 22 is provided at a center, around which a group of or a plurality of groups of all processing stations are multi-tiered. In this example, four processing groups G1, G2, G3, and G4 are disposed multi-tiered. The multi-tiered stations of the first and the second groups G1 and G2 are disposed on the front side of the system adjacent with each other (the front in FIG. 1). The multi-tiered stations of the third group G3 is disposed adjacent to the cassette block 10 and the multi-tiered unit of the fourth group G4 is disposed adjacent to the cabinet 12.

As shown in FIG. 2, in the first processing unit group G1, a SOD coating process station (SCT) is disposed. The SOD coating process station (SCT) supplies insulating film material while the wafer W is placed on a spin chuck in a cup CP and spun so that insulating film is coated uniformly on the wafer. In the present invention, as an insulating film material, a porous type material such as "porous SiLK" series, "ALCAP" and "JSR LKD" series, which are products of Dow Chemical Company, Asahi Kasei Corporation and JSR Corporation respectively, can be used.

In the second group G2, the SOD coating process station (SCT) is disposed on the upper tire. In addition, the SOD coating process station (SCT), the solvent exchanging process station and the like can be disposed on the lower tier of the second group G2 as necessary.

As shown in FIG. 3, within the third group G3, two cooling process stations (CPL), a transfer and cooling plate (TCP), the low temperature heating process station (LHP), the first heating process station 33 relating to the present invention, the second heating process station 32 relating to the present invention and low oxygen high temperature heating process stations (OHP) are multi-tiered. The cooling process station (CPL) has a cooling plate on which the wafer W is placed and performs the cooling process to the wafer W. The transfer and cooling plate (TCP) is structured to have two tiers; a cooling plate for cooling the wafer W on the lower tier and a transferring table on the upper tier and the wafer W is transferred between the cassette block 10 and the processing block 11. In the low temperature heating process station (LHP), the wafer W is heated at a temperature of, for example, in a range of 60° C. to 150° C. In the low oxygen high temperature heat processing station (OHP), a heating process is performed at a temperature higher than 200° C. in atmosphere of low oxygen concentration.

Within the fourth group G4, three cooling process stations (CPL), a low temperature heating process station (LHP), a first heating process station 33, a second heating process station 32 and low oxygen high temperature heating process stations (OHP) are multi-tiered.

In addition, depending on the process, an aging process station (DAC) for performing aging process by supplying gas including ammonia on the wafer may be disposed as one of the third group G3 and the fourth group G4.

As shown in FIG. 3, the main wafer transfer mechanism 22 has a wafer transfer device 30 that is capable of moving up and down in vertical direction (the Z-direction) inside a cylindrical supporter 27. The cylindrical supporter 27 is connected to a rotating shaft of a motor (not shown) and rotates integrally with the wafer transfer device 30 around the aforesaid rotating shaft by a rotational driving force of the motor. Accordingly, the wafer transfer device 30 can be rotated in θ-direction. A transfer base 40 of the wafer transfer device 30 is provided with, for example, three arms 31. These arms 31 reach the processing stations disposed around the main wafer transfer mechanism 22 and transfer the wafer W between these processing stations.

Figure 4:
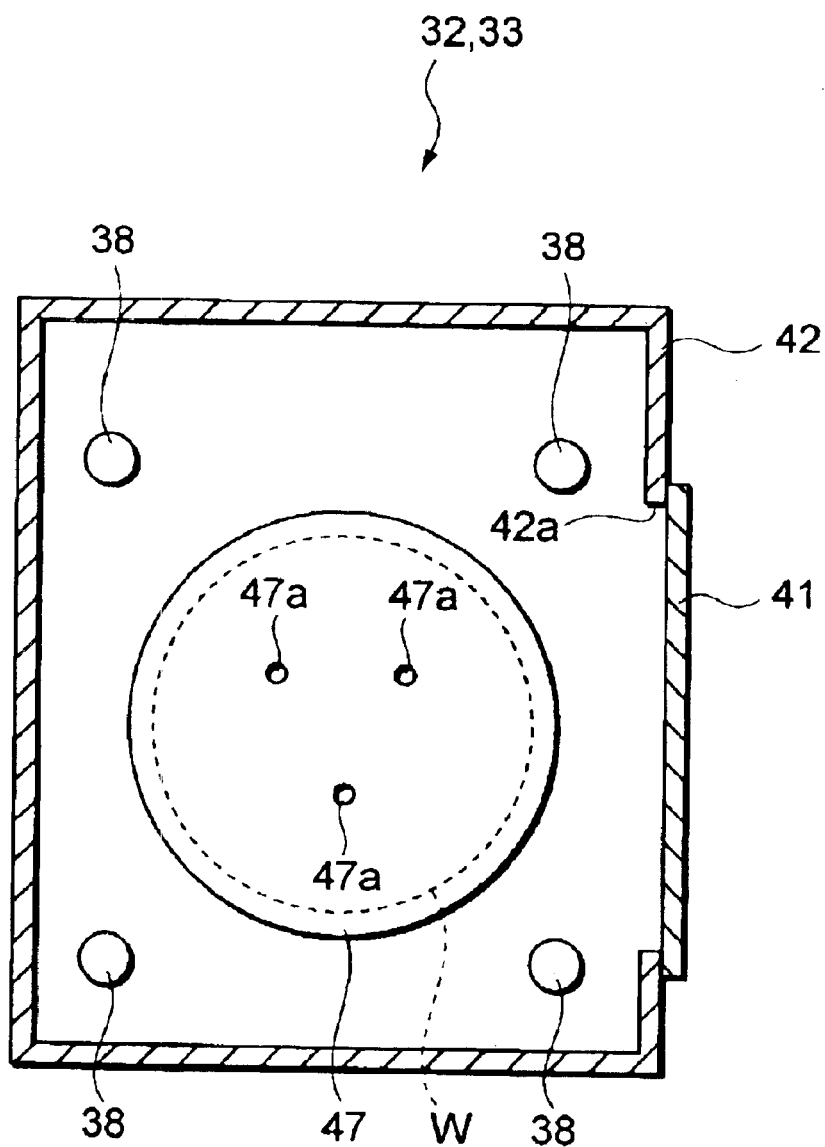
FIG. 4 is a plan view of a first and a second heating process station relating to the first embodiment of the present invention.
Figure 5:
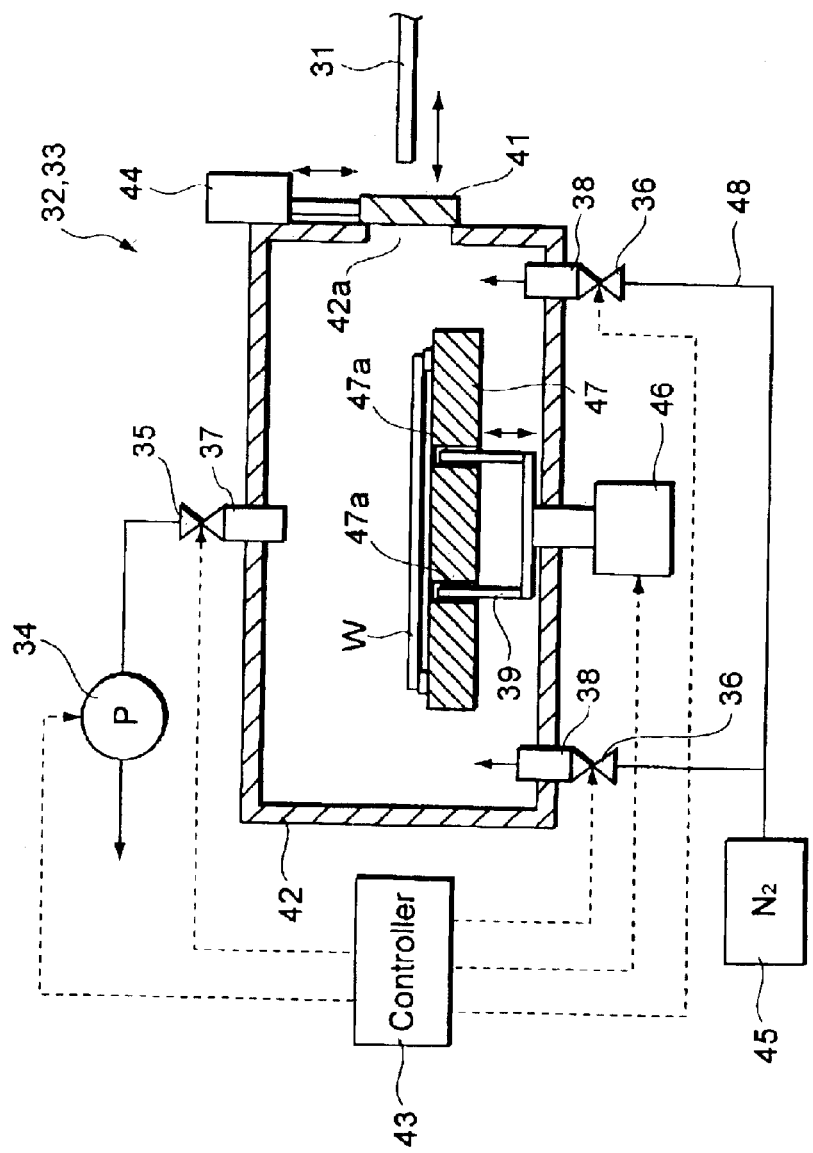
FIG. 5 is a sectional view of the first and the second heating process station shown in FIG. 4.

FIG. 4 and FIG. 5 are a plan view and a sectional view respectively of the first heating process station 33 according to the present invention.

The first heating process station 33 has a heating plate 47 in the chamber 42. In the chamber 42, an opening 42a is provided for transferring the wafer W with the aforesaid transferring arm 31. At this opening 42a, a shutter 41 is provided which, for example, may freely be opened and closed by driving the air cylinder 44. And inside the chamber 42 may be hermetically closed as the shutter 41 is closed.

The heating plate 47 is embedded with, for example, a heating wire (not shown), and the wafer W mounted on the heating plate 47 is heated thereby. The heating temperature is, for example, in a range of 150° C. to 250° C. The heating plate 47 has, for example, three guiding holes 47a. Supporting pins 39 for supporting the wafer W, which are structured to be ascendable and descendable driven by the motor 46, are capable of protruding and sinking from the surface of the heating plate 47 through the guiding holes 47a. Thereby the wafer W is transferred between the heating plate 47 and the arm 31, and the wafer W placed on the heating plate 47 is subjected to the heating process.

Around the heating plate 47, for example, a plurality of supply ports 38 are provided for introducing nitrogen gas supplied from the nitrogen gas supply source 45,into the chamber 42. The nitrogen gas is supplied into the chamber 42 through a supply pipe 48 and a valve 36.

In addition, the first heating process station 33 has a vacuum pump 34 for reducing the pressure inside the chamber 42. The vacuum pump 34 exhausts the air inside the chamber 42 through an exhaust opening 37 that is provided at the upper portion of the chamber 42. The exhaust opening 37 is provided with a valve 35 and when the vacuum pump 34 is in operation, the valve 35 is opened to exhaust air.

A controller 43 exercises general control over the opening and closing movement of the valves 35 and 36, the driving of the motor 46, the driving of the air cylinder 44 and the operation of the vacuum pump 34.

The structure of a second heating process station 33 is mostly the same as the aforesaid first heating process station 33. However, the heating temperature of the heating plate is different, and the temperature is set, for example, between 200° C. and 450° C.

Figure 6:
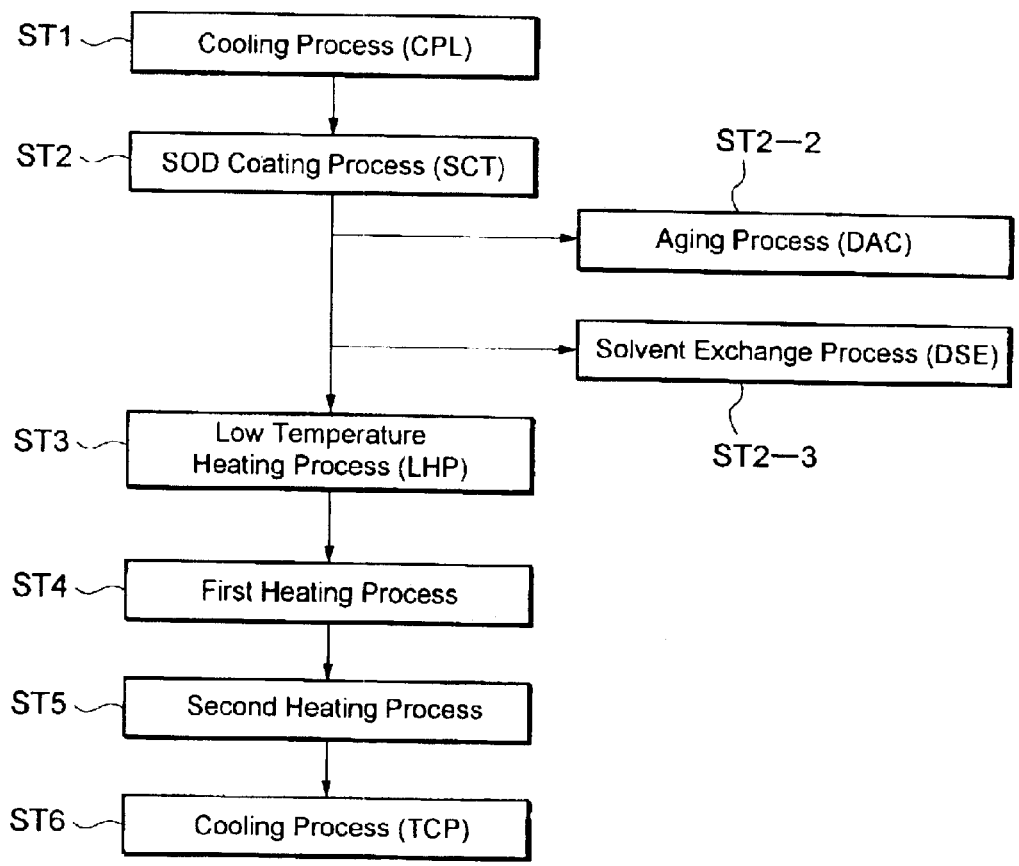
FIG. 6 is a flow chart showing the processing steps of the SOD system.

Next, processing steps of the SOD system 1 structured in above described manner is explained with reference to the flow chart in FIG. 6.

In the cassette block 10, the unprocessed wafer W is transferred from the wafer cassette CR to a transferring table of a transfer and cooling plate (TCP) in the third group G3 of the processing block 11 with the transfer mechanism 21.

After being transferred to the transferring table of the transfer and cooling plate (TCP), the wafer W is transferred to a cooling process station (CPL) with the main wafer transfer mechanism 22. Then in the cooling process station (CPL), the wafer W is adjusted to a temperature suitable for performing processes in the SOD coating process station (SCT) (Step 1).

The wafer W on which the cooling process is performed in the cooling process station (CPL) is transferred to the SOD coating process station (SCT) through the main wafer transfer mechanism 22. And in the SOD coating process station (SCT), the wafer W is subjected to the SOD coating process (Step 2).

After the SOD coating process is being performed in the SOD coating process station (SCT), the wafer W is transferred to a low temperature heating process station (LHP) through the main wafer transfer mechanism 22. Then in the low temperature heating process station (LHP), the wafer W is subject to a heating process at a temperature of, for example, 130° C. and a solvent such as thinner contained in an insulating film is volatilized (Step 3).

In addition, an aging process (DAC) (Step 2-2) or solvent exchange process (DSE) (Step 2-3) is performed after the coating process, depending on the types of the insulating film material.

After the heating process in the low temperature heating process station (LHP) is completed, the wafer W is transferred to the first heating process station 33 through the main wafer transfer mechanism 22 where a predetermined heating process is performed as will be described later. (Step 4) Incidentally, in some cases, the wafer w is transferred to the cooling process station (CPL) to be subjected to the cooling process after the Step 4.

The wafer W subjected to the cooling process is then transferred to the second heating process station 32 through the main wafer transfer mechanism 22, where the predetermined curing process is performed as will be described later. Thereafter, the wafer W is subjected to a cooling process at the cooling plate of the transfer and cooling plate (TCP) (Step 6).

After performing the cooling process on the cooling plate in the transfer and cooling plate (TCP), the wafer W is transferred to the wafer cassette CR through the wafer transfer mechanism 21 in the cassette block 10.

Next, the operation of the first heating process station 33 and the second heating process station 32 in the aforesaid Step 4 will be explained.

Figure 7:
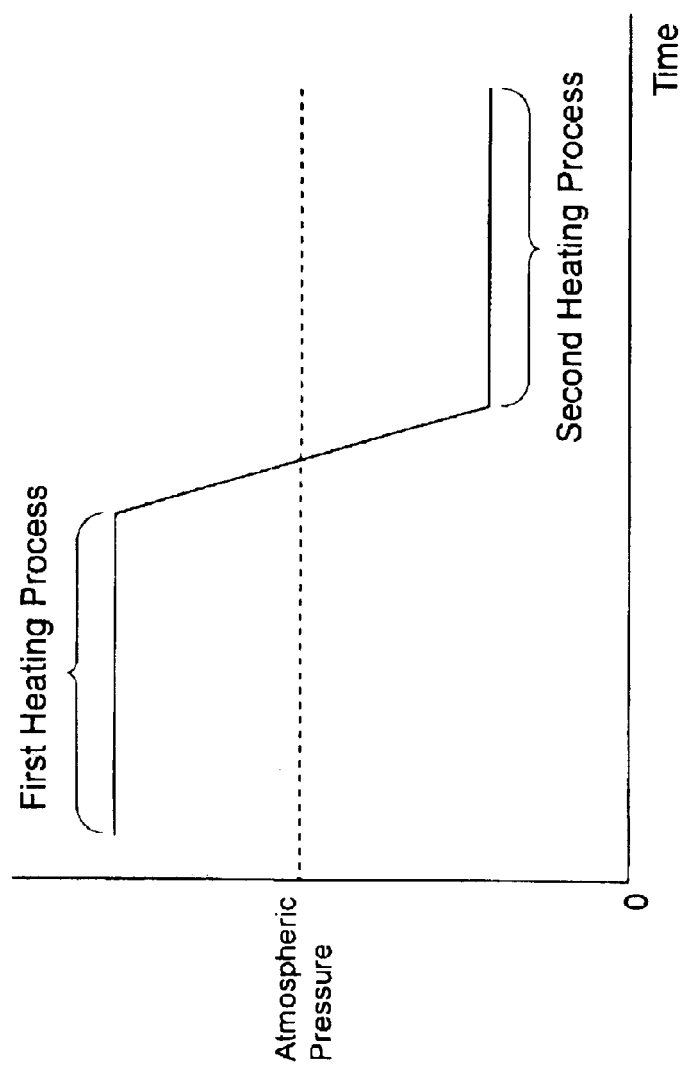
FIG. 7 is a graph showing the relation between time and pressure of the first and the second heating process.

In the first heating process station 33, at first, the shutter 41 opens and the arm 31 holding the wafer W is transferred through the opening 42a. When the wafer W is transferred to the supporting pins 39, the wafer W is left standing-by with the supporting pins kept at their raised position. Thereafter the valve 35 opens, the vacuum pump 34 operates and the atmospheric gas inside the chamber 42 is exhausted. Next, the valve 36 opens and nitrogen gas is supplied from the nitrogen gas supply source 45 into the chamber 42. Here, FIG. 7 shows the pressure change inside the chamber 42 provided in both of the first heating process station and the second heating process station. The nitrogen gas is supplied, until the pressure inside the chamber 42 becomes higher than the atmospheric pressure. At this point, the pressure is preferred to be in a range of 100 kPa to 200 kPa. When the pressure inside the chamber reached the described condition, the supporting pins 39 moves down and the wafer W is placed on the heating plate 47. Then the first heating process is performed at a temperature of, for example, 200° C. Heating the wafer at a pressure higher than atmospheric pressure prevents the porogen to desorb from the insulating film, therefore, a molecular frame can be formed in a good condition.

When the first heating process is performed before the pressure inside the chamber becomes higher than the atmospheric pressure, for example, in a case where the pressure is controlled while heating, the wafer is heated before the pressure reaches to a predetermined value. In such case, at the time when heating is started, desorption of the porogen occurs since the pressure exerted on the wafer is insufficient. In the present invention, desorption of the porogen is restrained without fail by heating the wafer W after the pressure inside the chamber became higher than the atmospheric pressure, therefore, the insulating film of high quality can be formed.

Similarly, in the second heating process station 33, the vacuum pump is operated to reduced the pressure inside the chamber and the second heating process (curing process) is performed as shown in FIG. 7. At this point, the wafer W carried into the chamber 42 is not placed on the heating plate 47 until the pressure inside the chamber 42 becomes the predetermined value and the wafer W is placed, for example, on the raised pins 39. After the pressure inside the chamber 42 reached the predetermined value, the supporting pins 39 moves down and the wafer W is placed on the heating plate 47 and the wafer is subjected to the second heating process. In such manner, performing the heating process at the pressure lower than the atmospheric pressure accelerates the desorption of the porogen, in other words, oxidation is accelerated and a hard insulating film of high quality can be formed. The pressure at this point is preferred to be in a range of 100 Pa to 100 kPa. Furthermore, having the temperature of the second heating process higher than the temperature of the first heating process and performing the curing process at a temperature of, for example, 400° C. contributes to accelerating oxidation. In this curing process, "desorption of the porogen" is performed in the same time as "burning to harden" the insulating film, the oxygen concentration inside the chamber 42 and heating temperature are preferred to be controlled precisely, by supplying nitrogen gas into the chamber 42.

Moreover, when the second heating process is performed before the pressure inside the chamber 42 becomes lower than the atmospheric pressure, for example, in a case where the pressure is regulated while heating, the wafer is heated before the pressure reaches to the predetermined value. In such case, at the time when heating is started, desorption of the porogen is accelerated due to the insufficient pressure exerted on the wafer. In the present invention, desorption of the porogen is restrained without fail as performing the curing process after the pressure inside the chamber 42 reached a predetermined value, therefore, the insulating film of high quality can be formed.

Meanwhile, in the present invention, a pressure sensor may be disposed inside the chamber provided in both of the first heating process station 33 and the second heating process station 32, so that the pressure inside the chamber at a time of each heating process can be controlled while using a feedback of the results measured by the pressure sensor. Moreover, a sensor detecting the concentration of oxygen may be disposed inside the chamber provided in both of the first heating process station 33 and the second heating process station 32, so that the oxygen concentration inside the chamber at a time of each heating process may be controlled.

Figure 8:
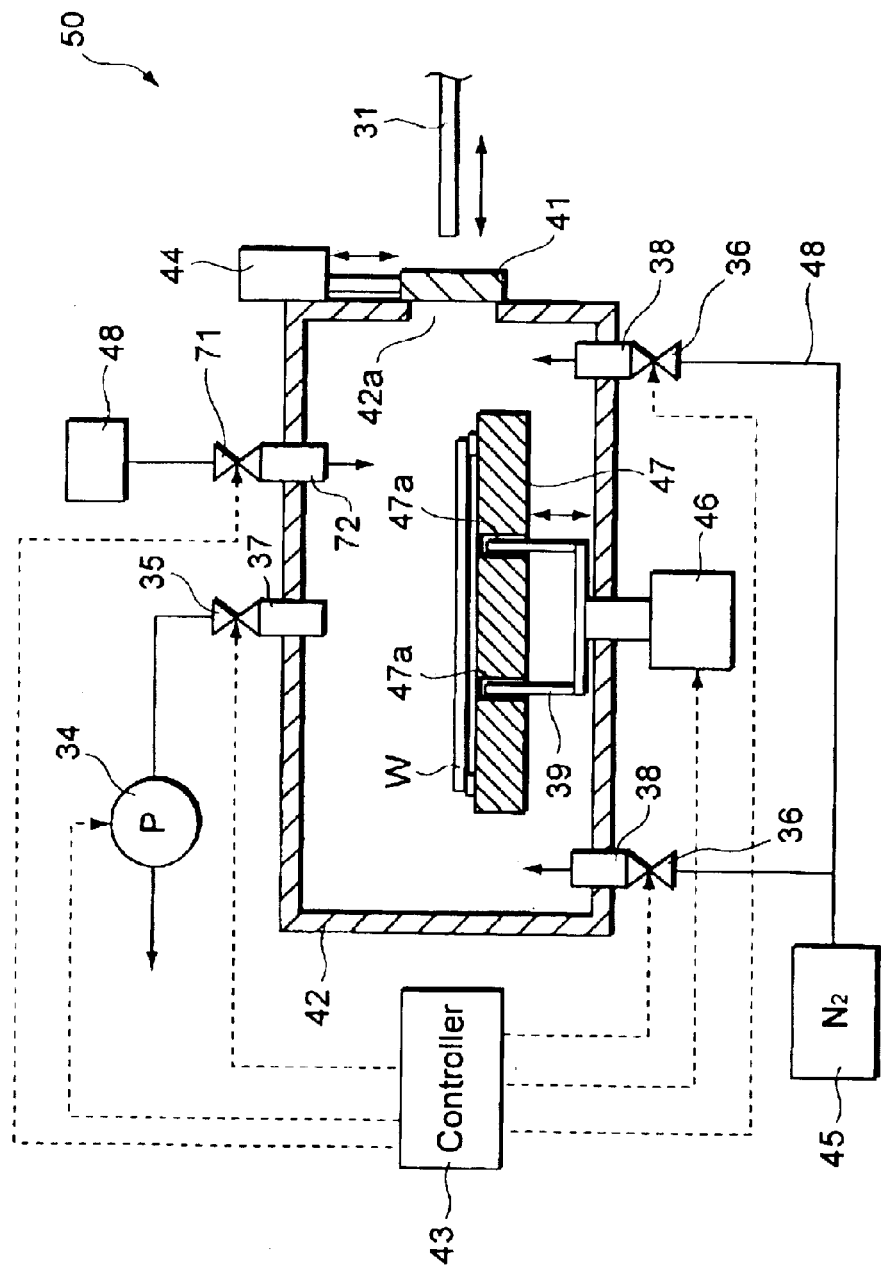
FIG. 8 is a sectional view of the first heating process station relating to another embodiment of the present invention.

FIG. 8 is a sectional view showing another embodiment of the first heating process station 33. Incidentally in FIG. 8, the same numerals will be used to designate the same components as those in FIG. 5, and the explanation thereof will be omitted.

For example, in a first heating process station 50, a supply port 72 supplying gas from a gas supplying source 48 inside the chamber 42 is provided at upper portion of the chamber 42. The supply port 72 is opened and closed with a valve 71 and the controller 43 controls opening and closing of the valve 71. Porous type materials coated in the SOD coating process station (SCT), Porous SiLK series, a product of Dow Chemical or ALCAP series a product of Asahi Kasei Corporation is used, converted into gas form and used as the gas to be supplied from the gas supplying source 48.

In the present invention, when the wafer W is carried into the chamber 42 and transferred to the supporting pins 39, the wafer W is left standing-by with the supporting pins being in their raised position. The valve 35 opens, the vacuum pump 34 operates and the atmospheric gas inside the chamber 42 is exhausted. Next, the valve 36 opens and nitrogen gas is supplied from the nitrogen gas supply source 45 into the chamber 42. In the same time, the valve 71 opens and the insulating film material is introduced into the chamber. When the pressure inside the chamber reached the predetermined vale, the wafer W is placed on the heating plate 47 and the heating process is performed. At this point, the pressure inside the chamber 42 is higher than atmospheric pressure and preferred to be in a range of 100 kPa to 100 kPa. The heating temperature in this case is, for example, 200° C.

Heating the wafer W at a pressure higher than atmospheric pressure in such manner, moreover, heating in the atmosphere containing the same materials as the materials of the insulating film on the wafer subjected to the heating process, the desorption of the porogen from the insulating film can be restrained, therefore, a molecular frame of even better condition can be formed.

In addition, desorption of the porogen is restrained without fail as heating the substrate after the pressure inside the chamber reached a predetermined value, so that the insulating film of high quality can be formed.

Figure 9:
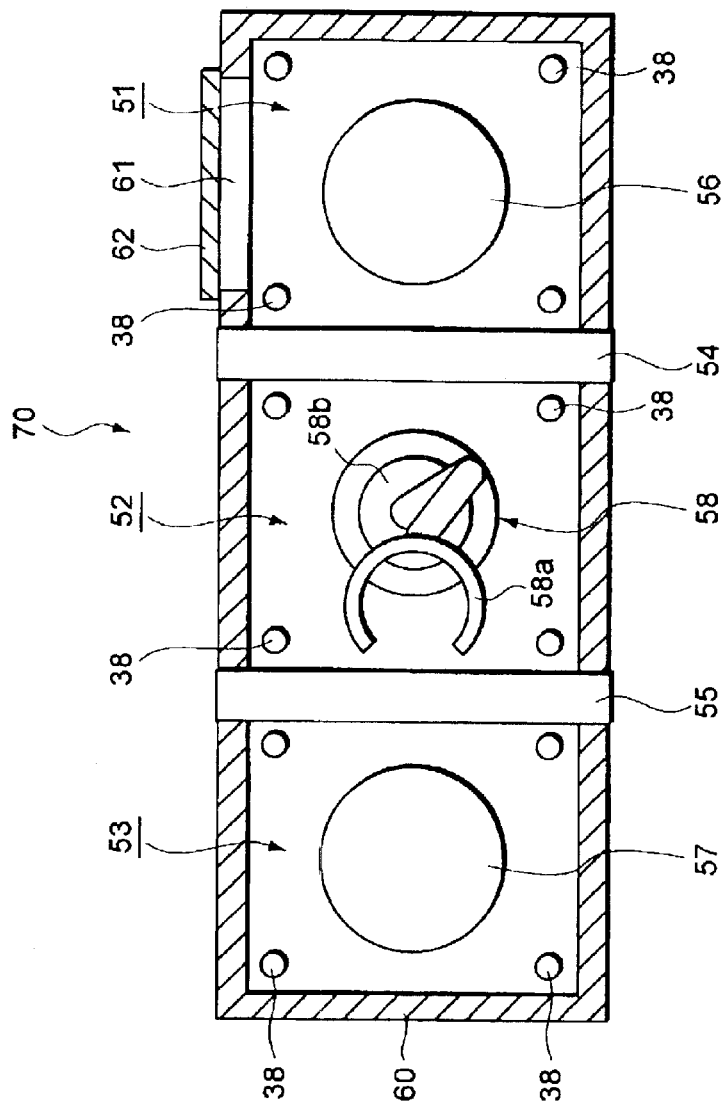
FIG. 9 is a sectional view of the heating process station relating to yet another embodiment of the present invention.
Figure 10:
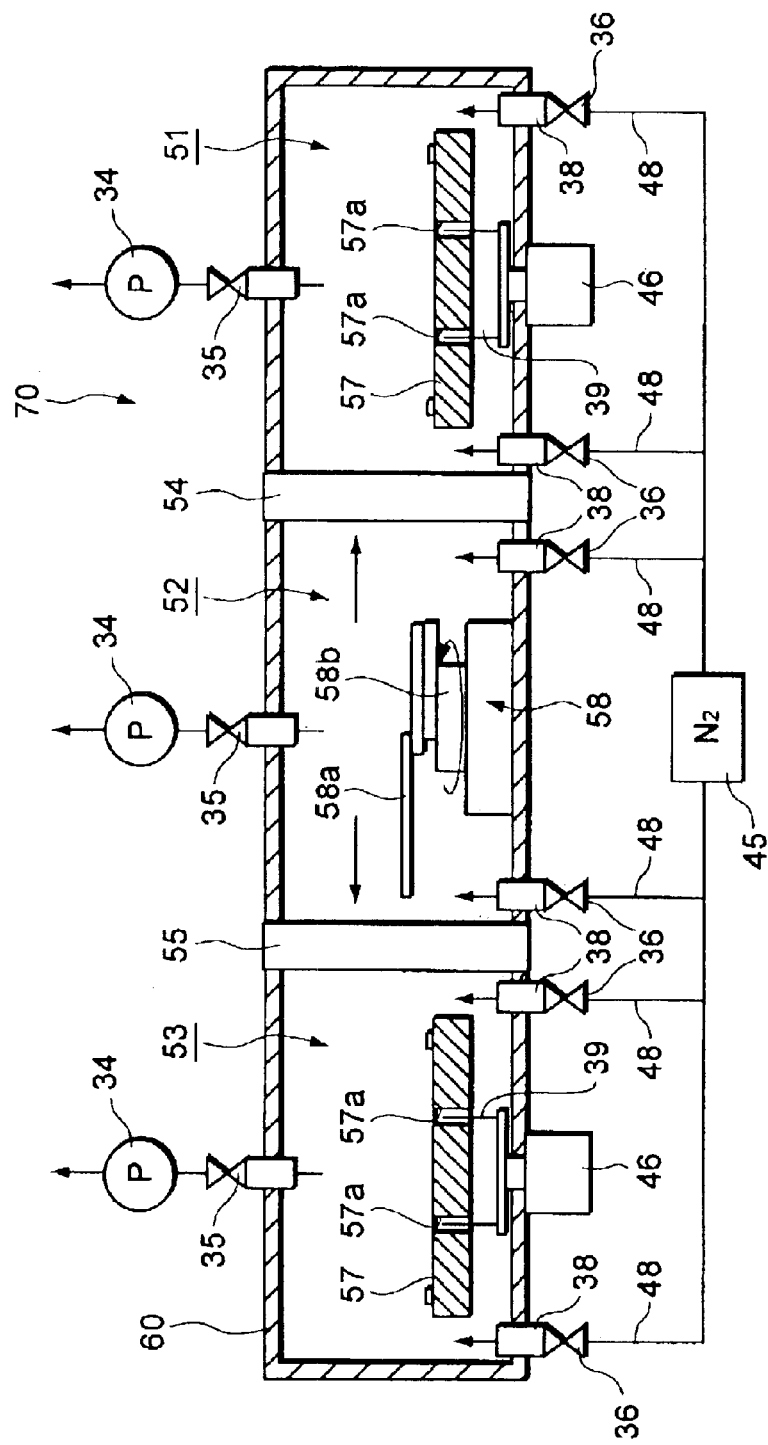
FIG. 10 is a sectional view of the heating process station shown in FIG. 9.

FIG. 9 and FIG. 10 shows yet another embodiment of the present invention for the first heating process station and the second heating process station.

The first heating process station 33 and the second heating process station 32 described above are integrated into a heating process station 70. For example, a first heating chamber 51, a transferring chamber 52 and a second heat processing chamber 53 are disposed linearly inside a chamber 60. These processing chambers are divided into three blocks by two gate valves 54 and 55, provided inside the chamber 60.

A heating plate 56 and a heating plate 57 are provided inside the first heat processing chamber 51 and the second heat processing chamber 53 respectively. A plurality of supporting pins 39 for supporting the wafer and capable of moving up and down by the operation of a motor 46 are provided at a lower portion of the heating plate 56 and the heating plate 57 respectively. Additionally, a multi-articular type transfer mechanism 58 is disposed in the transferring chamber 52 located between the first heat processing chamber 51 and the second heat processing chamber 53. The transfer mechanism 58 causes a tweezers 58a holding the wafer to move backward and forward in a horizontal direction. The transfer mechanism 58 transfers the wafer to and from the heating plate 56 and the heating plate 57 disposed in the first processing chamber 51 and the second processing chamber 53 as rotating in the horizontal plane using a rotating axis 58b.

A plurality of supply ports 38 for introducing nitrogen supplied from nitrogen gas supply source 45 through a supply pipe 48, a valves 36 are provided at a lower portion of each chamber 51, 52 and 53. Furthermore, exhaust ports 37, capable of being opened and closed with the valve 35, for exhausting inside the each processing chamber with the operation of the vacuum pump 34 are provided, for example, at an upper portion of each chamber 51, 52 and 53.

In addition, an opening 61 for transferring the wafer between the transferring mechanism disposed outside (not shown) is provided at the side of the first heat processing chamber 51. The opening 61 can be opened and closed freely by a shutter 62. Meanwhile, movement of the gate valves 54 and 55, valves 35 and 36, a vacuum pump 34, a motor 46 and so on is controlled by a controller (not shown).

In the heating process station 70 structured as such, at first, the wafer carried into the first heat processing chamber through the opening 61, is placed on the plurality of supporting pins 39. At this state, the shutter 62 and the gate valve 54 is closed so that the chamber is hermetically closed. Then the atmosphere inside the chamber is exhausted as the vacuum pump 34 operates and the nitrogen gas is supplied into the first processing chamber 51 from the nitrogen gas supply source 45. When the pressure inside the chamber becomes a ready state for processing, the wafer W is placed on the heating plate 57 and, in the same time, a first heating process is performed at a pressure higher than the atmospheric pressure and at a temperature of, for example, 200° C. With this configuration, the desportion of the porogen from the insulating film on the wafer can be restrained. In addition, desorption of the porogen is restrained without fail as heating the substrate after the pressure inside the chamber reached a predetermined value, so that the insulating film of high quality can be formed.

During the first heating process, the atmosphere of the transferring chamber 52 is conditioned to be the same (the same pressure and the same oxygen concentration) as that of the first processing chamber 51. When the first heating process is completed, the gate valve 54 opens, and the wafer W is carried out and transferred to the transferring chamber 52. Then the gate valve 54 is closed, and the pressure inside the transferring chamber 52 is reduced so that the atmosphere becomes the same as the atmosphere of the second heat processing chamber 53. In other words, the atmosphere of the second heat processing chamber 53 is lower than the atmospheric pressure and the pressure inside of the transferring chamber 52 is reduced so that the pressure becomes the same as that of the second heating chamber. Then the gate valve 55 opens, the wafer W is placed on the heating plate 57 in the second heat processing chamber and the gate valve 55 is closed. The wafer is subjected to a heating process (curing process) at a pressure lower than the atmospheric pressure and at a temperature of, for example, 400° C. In the curing process, supply of nitrogen gas into the second heat processing chamber is optional. With the second heating process, as described herein the desorption of the porogen from the insulating film can be accelerated therefore an insulating film of high quality can be formed. Additionally, desorption of the porogen is accelerated without fail as performing the curing process after the pressure inside the chamber 42 reached a predetermined value, therefore, the insulating film of high quality can be formed.

Figure 12:
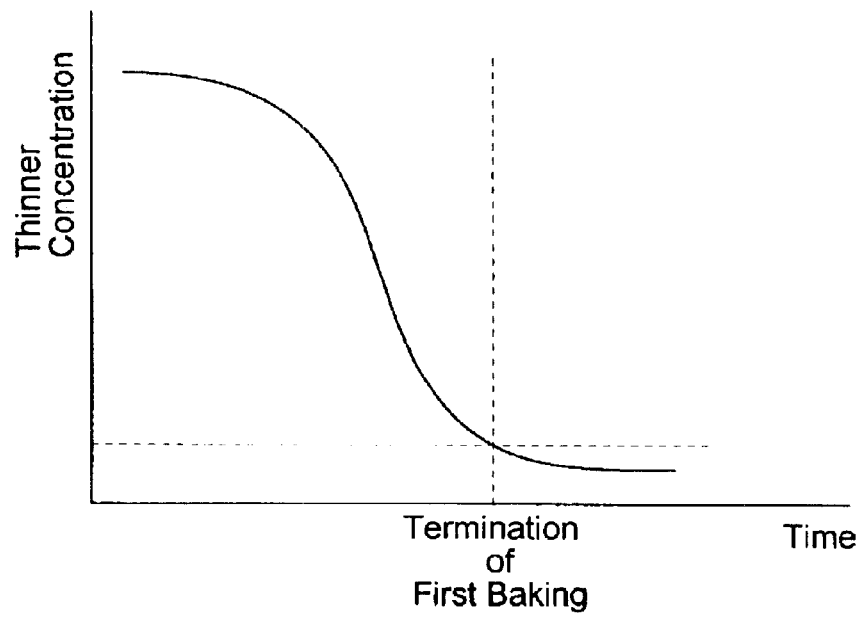
FIG. 12 is a diagram showing the relation between the amount of the thinner evaporated from an insulating film and heating time during the first baking.
Figure 13:
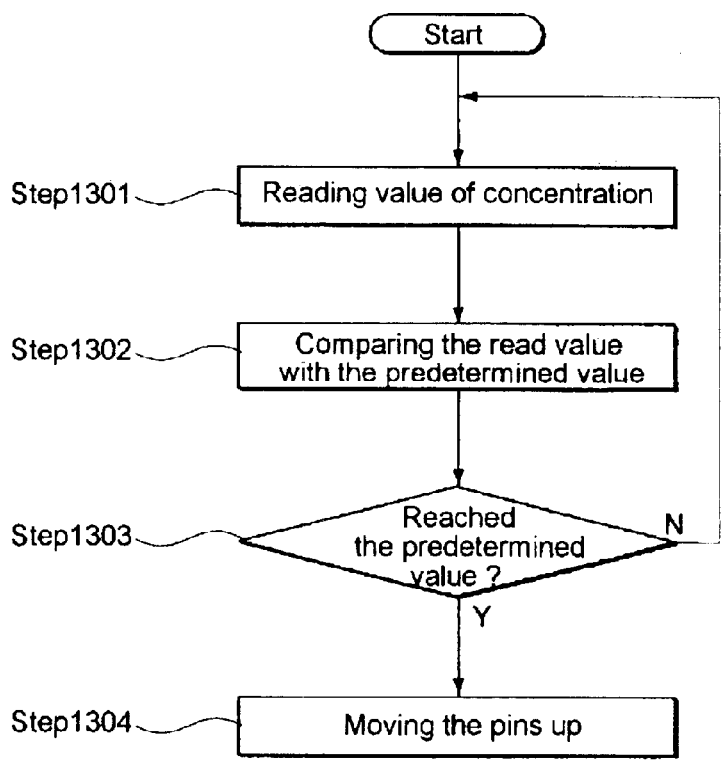
FIG. 13 is a flow chart showing the steps of controlling the start of the second baking after the first baking is completed.
Figure 14:
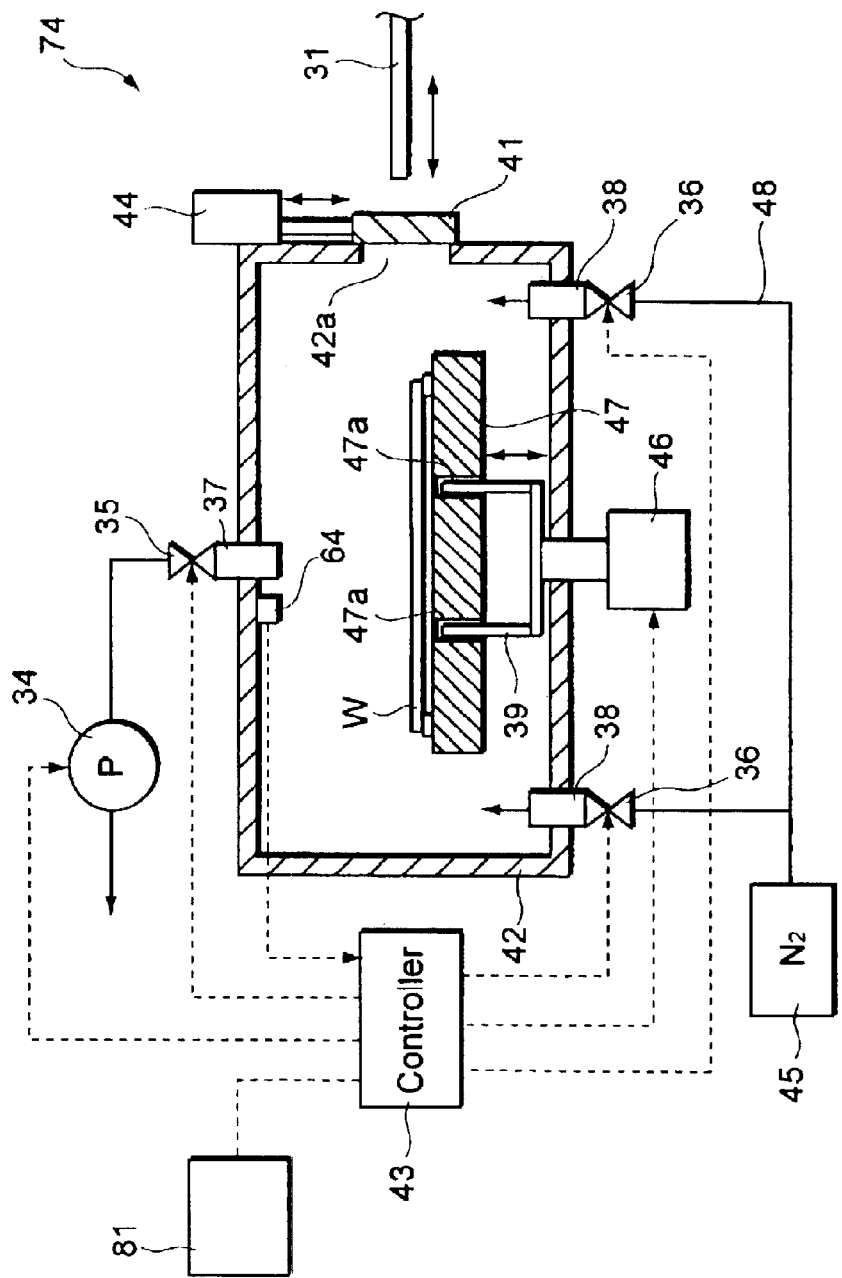
FIG. 14 is a sectional view of the second heating process station relating to yet another embodiment, of the present invention.
Figure 15:
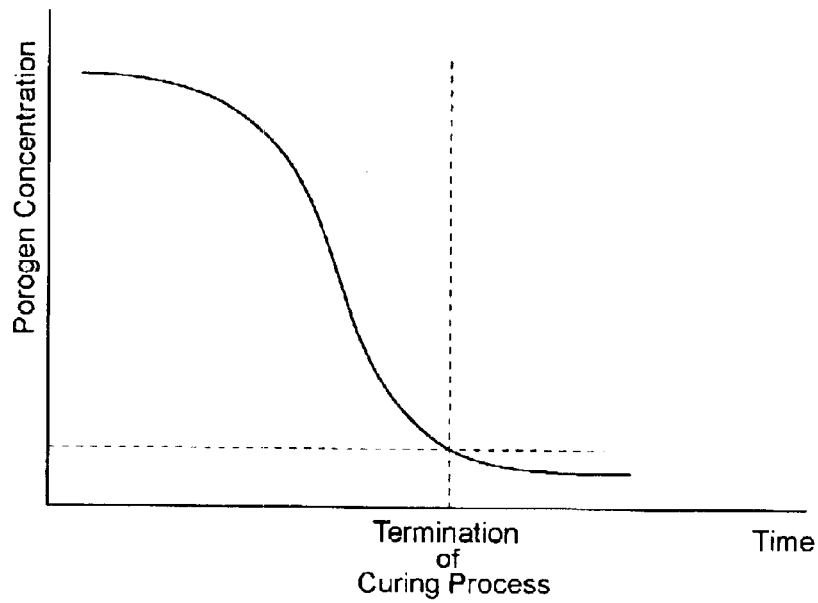
FIG. 15 is a diagram showing the relation between heating time and amount of porogen evaporated from the insulating film during the curing process.
Figure 16:
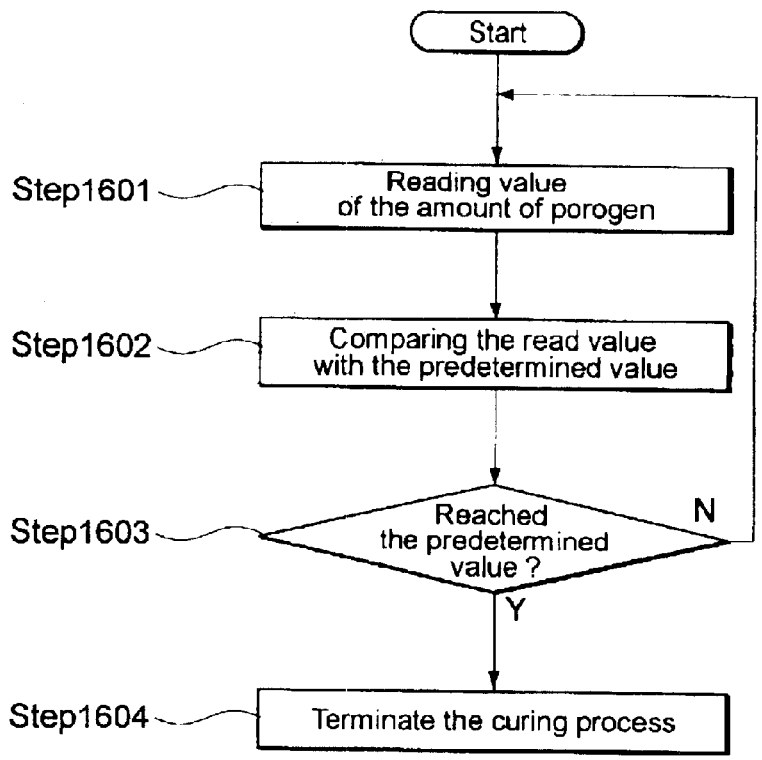
FIG. 16 is a flow chart showing the steps of controlling to finish the curing process.

Next, another embodiment of the first heating process station and the second heating process station will be explained referencing FIGS. 11, 12, 13, 14, 15 and 16. The same numerals will be used to designate the same components as those in FIG. 5, and the explanation thereof will be omitted. Incidentally, FIGS. 11, 12 and 13 showing a first heating process station, and FIGS. 14, 15 and 16 showing a second heat processing station.

First, a structure of the first heating process station will be explained. FIG. 11 is a diagram showing an internal structure of the first heat processing chamber. In a first heat processing chamber 73, a solvent, for example, a thinner contained in the insulating film is evaporated (first baking) and a heating process is performed in order to formed a frame of the insulating film (second baking). The first baking is preferable to be performed at a pressure of 100 kPa to 200 kPa. Moreover, the heating temperature in this case is, for example, 200° C. The second baking is performed with the pressure inside the chamber being higher than that of the first baking and the temperature is kept the same at 200° C. Therefore, when starting the second baking after the first baking is completed, the supporting pins 39 are caused to move upward so that the wafer W is placed away from the heating plate. Then the valve 36 is opened and the nitrogen gas is supplied into the chamber 42 from the nitrogen gas supply source 45. Thereafter, when the pressure inside the chamber 42 reached a predetermined value, the supporting pins 39 moves down and the wafer W is placed on the heating plate. The first heat processing chamber 73 has a sensor 63 detecting concentration and a data storing portion 80. The sensor 63 is provided near the exhaust opening 37 of the first heat processing chamber 73 and detects the concentration of the thinner evaporated during the first baking.

A concentration of the evaporated thinner during the first baking will be explained referencing FIG. 12. When the first baking is started, the thinner vigorously evaporates from the insulating film. In other words, the concentration of the thinner evaporating from the insulating film is high at the start of the first baking. The evaporated thinner will be exhausted from the exhaust opening 37. As the thinner in the insulating film decreases due to the evaporation, the concentration of the evaporating thinner becomes lower gradually. When all the thinner contained in the insulating film evaporates, only the thinner floating in the air of chamber 42 is exhausted, therefore, the concentration of the thinner contained the exhaust gas becomes lower.

Figure 11:
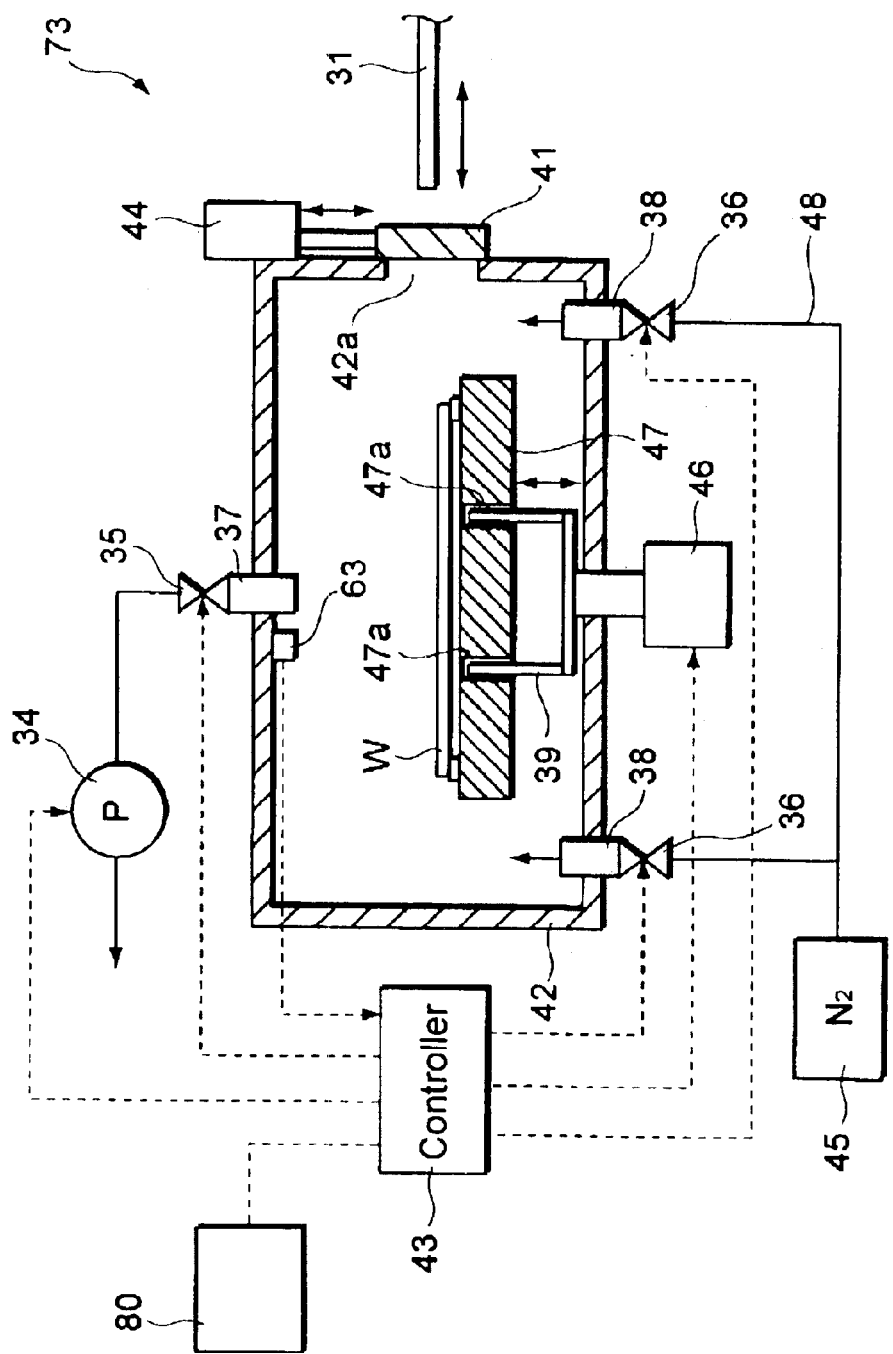
FIG. 11 is a sectional view of the first heating process station relating to yet another embodiment of the present invention.

The concentration of the thinner in the exhaust can be detected having the sensor 63 detecting concentration disposed near the exhaust opening 37 as shown in FIG. 11. The timing when the first baking to be terminated can be calculated. For example, the concentration when only the thinner floating in the air of the chamber 42 that is exhausted from the insulating film is previously detected. First, baking can be controlled to terminate and the second baking can be controlled to start when the value of the concentration detected by the sensor 63 is decreased to the previously detected value. The previously detected value is stored, for example, in the data storing portion 80. A controller 43 may be used for above described control.

Next, controlling to terminate the first baking and to start the second baking in the most appropriate timing will be explained referencing the FIG. 13. FIG. 13 is a flow chart showing the processing steps of the control system.

Firstly, the controller 43 reads the value detected by the sensor 63 (Step 1301). Secondly the value that stored in the data storing portion 80 and the value obtained in the Step 1301 is compared (Step 1302). Thirdly, whether the value obtained from the sensor 63 detecting concentration has reached to the value that stored in the storing portion is judged (Step 1303). When the value has not reached the stored Value, the Step 1301 is repeated. When the value has reached to the stored value, the first baking is assumed to have completed and the supporting pins 39 are moved up while holding the wafer W. After that, the valve 36 is opened, nitrogen gas is supplied into the chamber 42 and the second baking is started. With this configuration, the timing of terminating the first baking and starting the second baking can be calculated.

Regarding the second baking, the time taken for the formation of the molecular frame of the insulating film is measured beforehand, and the measured value can be stored in the data storing portion. With such configuration, the second baking can be terminated and the curing process can be strated in the second heating process station after performing the second baking for a predetermined time period.

Next, a structure of the second heating process station will be explained. FIG. 14 is a diagram showing an internal structure of the second heat processing chamber. In the second heat processing chamber 74, curing process contributes to accelerate the oxidation. In the curing process "desorption of the porogen" is performed in the same time as the "burning to harden" process of the insulating film. At this point, the pressure inside the chamber is preferred to be in a range of 100 Pa to 100 kPa. As a result, the desorption of the porogen can be accelerated. The heating temperature is higher than the first baking and the second baking, for example, 400° C. The second heat processing chamber 74 has a porogen sensor 64 and a data storing portion 81. The porogen sensor 64 is provided near the exhaust opening 37, of the first heating process chamber 74 and detects the concentration of the porogen evaporated during the curing process.

A concentration of the evaporated porogen during the curing process will be explained referencing FIG. 15. When the curing process is started, the porogen vigorously evaporates from the insulating film. In other words, the concentration of the porogen evaporating from the insulating film is high at the start of the curing process. The evaporated porogen will be exhausted from the exhaust opening 37. As the thinner in the insulating film decreases due to the evaporation, the amount of the evaporating porogen decreases gradually. When all the porogen contained in the insulating film evaporates, only the porogen floating in the air of chamber 42 is exhausted, therefore, the amount of the porogen contained the exhaust gas decreases.

The amount of the porogen in the exhaust can be detected having the concentration detecting sensor 64 disposed near the exhaust opening 37 as shown in FIG. 14. The timing when the curing process to be terminated can be calculated. For example, the concentration when only the porogen floating in the air of the chamber 42 being exhausted is previously detected using the porogen sensor 64. The curing process can be terminated when the detected value of the porogen decreased to the previously detected value. The previously detected value is stored, for example, in the data storing portion 81. The controller 43 may be used for above described control.

Next, controlling to terminate the curing process in the most appropriate timing will be explained referencing the FIG. 16. FIG. 16 is a flow chart showing the processing steps of the control system.

First, the controller 43 reads the value detected by the porogen sensor 64 (Step 1601). Secondly the value that stored in the data storing portion 81 and the value obtained in the Step 1601 is compared (Step 1602). Thirdly, whether the value obtained from the porogen sensor 64 is reached to the value that stored in the storing portion is judged (Step 1603). When the value has not reached the stored value, the Step 1601 is repeated. When the value has reached the stored value, the curing process is terminated (Step 1604). With this configuration, the timing of terminating the curing process can be calculated. In such configuration, the first baking, the second baking and the curing process can be performed and terminated in appropriate timing.

Next, another embodiment of the first heat processing station and the second heat processing station will be explained referencing FIGS. 17, 18, 19 and 20. The same numerals will be used to designate the same components as those in FIG. 5, and the explanation thereof will be omitted.

Figure 17:
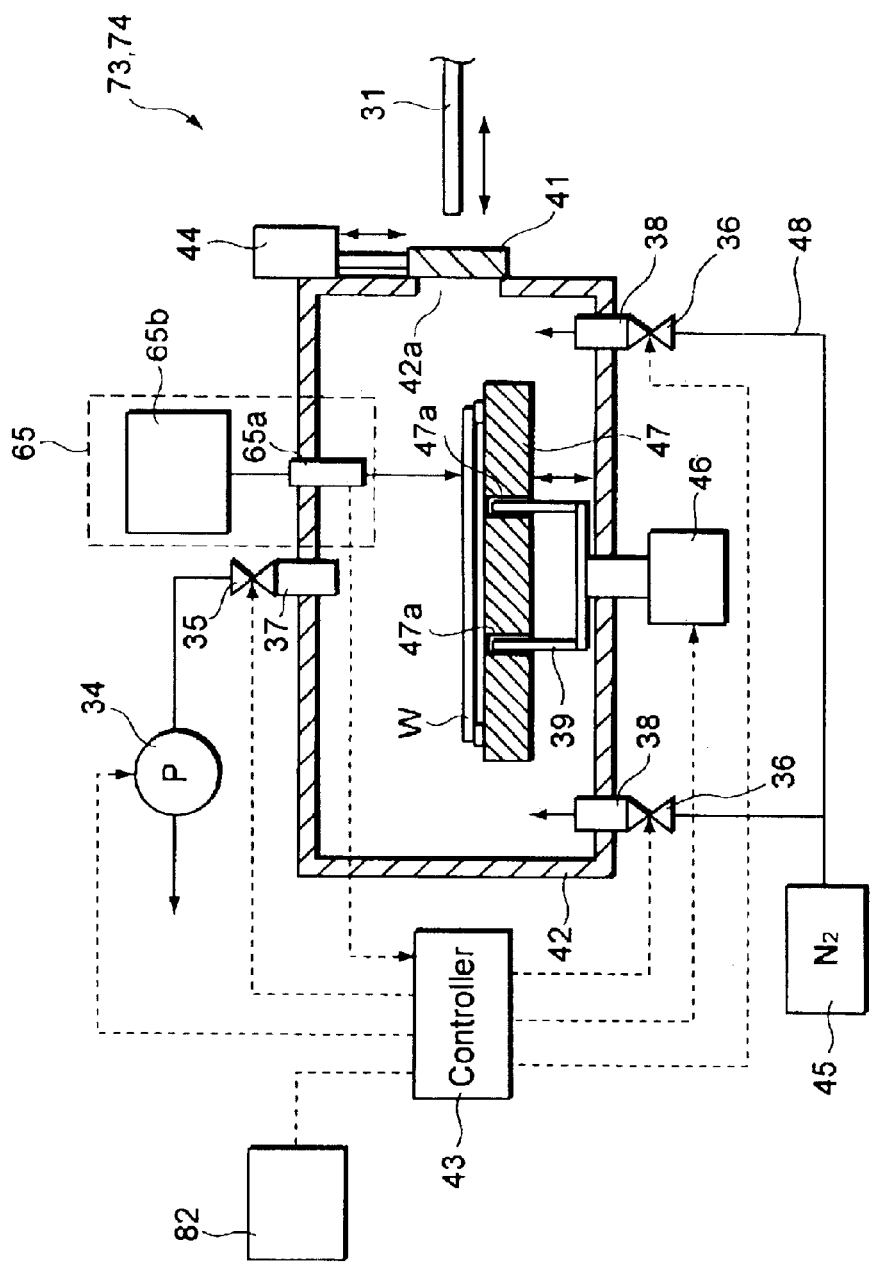
FIG. 17 is a sectional view of the first heating process station, second heating process station relating to yet another embodiment of the present invention.
Figure 21:
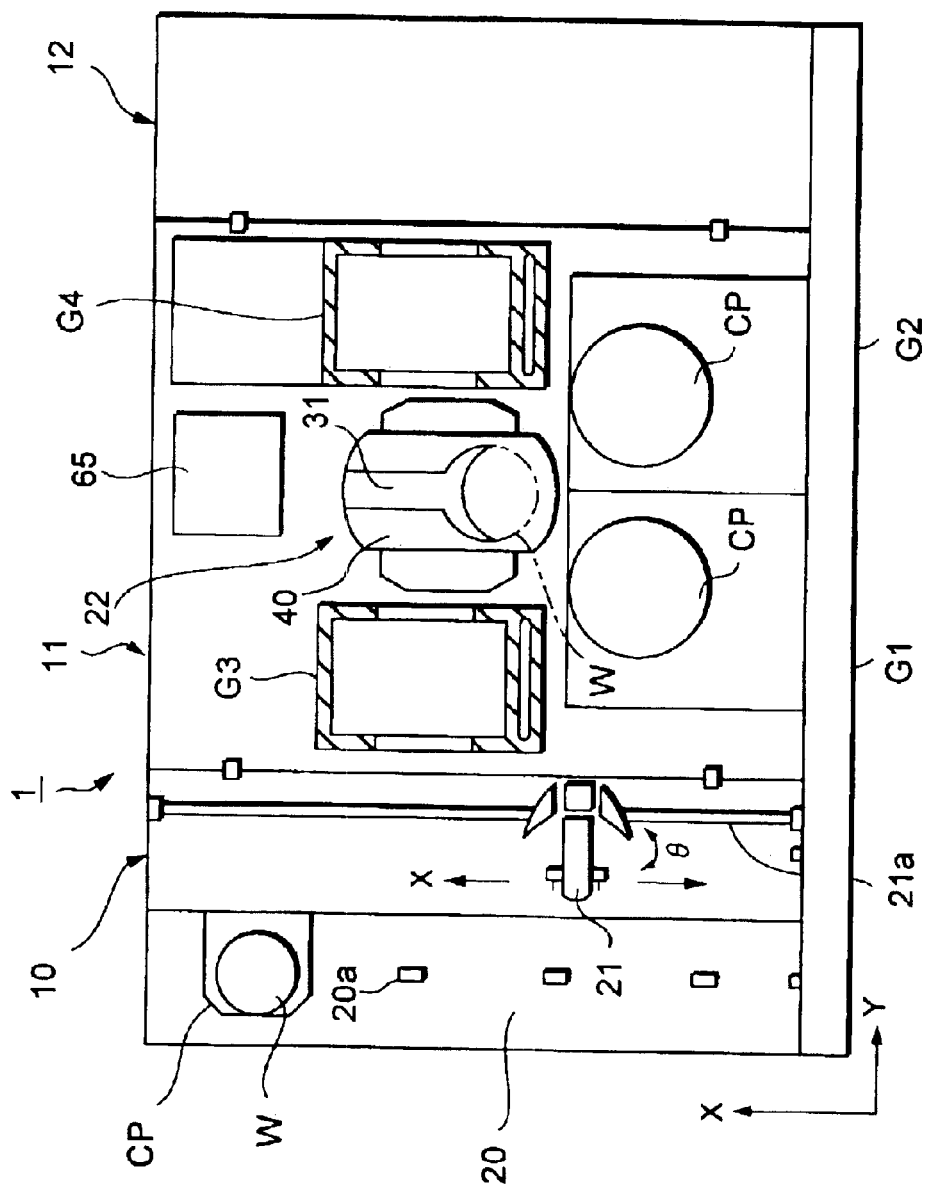
FIG. 21 is a plan view showing a SOD system according to another embodiment of the present invention.

As shown in FIG. 17, a film thickness measuring apparatus 65 measuring the film thickness of the insulating film is provided. The film thickness measuring apparatus 65 has a light emitting and light receiving portion 65a provided at a place like ceiling of the chamber 42, and a film thickness measuring portion 65b provided, for example, in a processing block 11 shown in FIG. 21. The light emitting and light receiving portion 65a has an optical system such as lenses. The light emitting and light receiving portion 65a irradiates light with a wave length of 190 nm to 1000 nm (ultra violet ray, visible light, infrared ray etc.) to the insulating film while being heated in the second heating process station. The light reflected to the insulating film is sent from the light emitting and light receiving portion 65a to the film thickness measuring portion 65b. The film thickness measuring portion reads the wavelength of the sent light and measures the film thickness of the insulating film.

Figure 18:
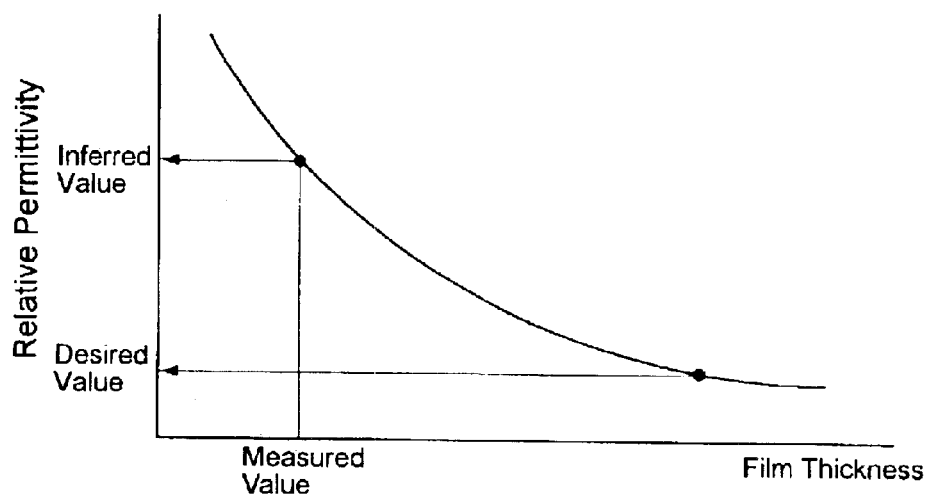
FIG. 18 is a diagram showing the correlation between the film thickness and relative permittivity of the insulating film in the heating process.
Figure 19:
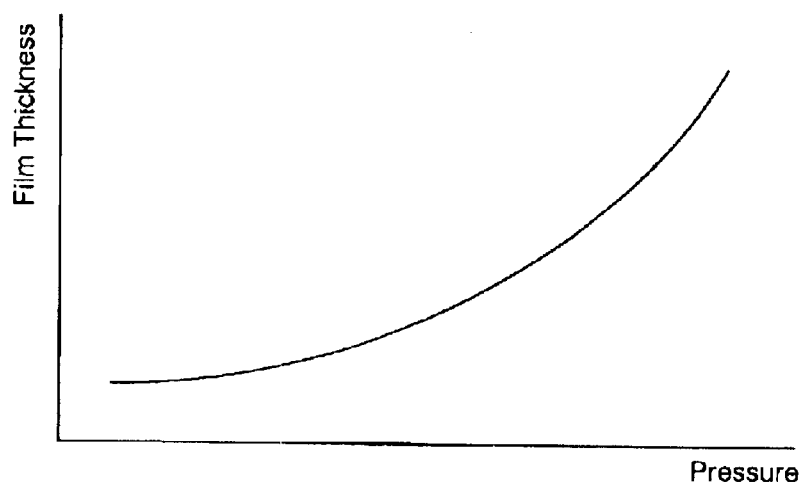
FIG. 19 is a diagram showing the correlation between the pressure in the heating process and the film thickness of the insulating film.

Referencing FIG. 18, for example, when the insulating film is formed using materials like ALCAP and CCIC, there exists a correlation between the film thickness of the insulating film and the relative permittivity. In other words, when the film thickness of the insulating film is at a certain value, the relative permittivity is at a value that corresponds the certain value. Therefore, measuring the film thickness of the insulating film enables to infer the relative permittivity of the insulating film corresponding to the measured value of the film thickness. As shown in FIG. 19, the film thickness of the insulating film depends on the pressure at the time of the heating process. For this reason, the inferred relative permittivity does not correspond with the desired value, the pressure is adjusted while heating so that the relative permittivity becomes closer to its desired value. As a result, the insulating film of high quality can be formed. The controller 43 may be used for the pressure adjustment described as above. Regarding the correlation between the relative permittivity and the insulating film may be obtained, for example, measuring a film thickness of different insulating films beforehand using an electrical measuring method. The value of desired relative permittivity can be measured beforehand. The previously measured value may be stored, for example, in a data storing portion 82.

Figure 20:
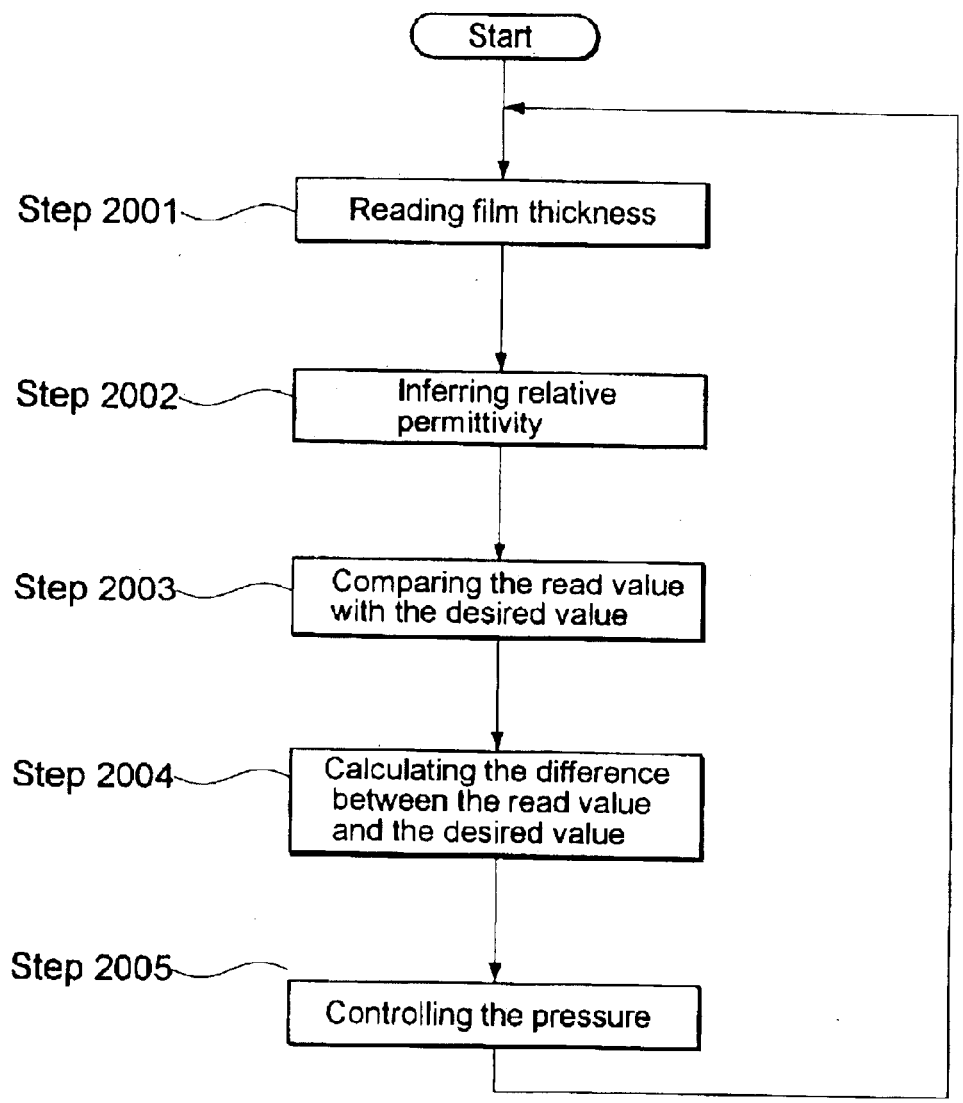
FIG. 20 is a flow chart showing the steps of controlling the pressure by estimating the relative permittivity from the film thickness of the insulating film.

Next, the steps of controlling the pressure by inferring the relative permittivity from the measured film thickness of the insulating film will be explained using FIG. 20. FIG. 20 is a flow chart showing the processing steps of the control system.

First, the controller 43 reads the value measured by the film thickness measuring apparatus 65 (Step 2001). Secondly, the relative permittivity of the insulating film is inferred using a data on the correlation that stored in the data storing portion 82 (Step 2002). Secondly, the inferred value of the relative permittivity is compared with the desired value of the relative permittivity stored in the data storing portion 82 (Step 2003). Thirdly, the difference between the inferred value of the relative permittivity and the stored value of the relative permittivity compared in the Step 2003 is calculated (Step 2004). The pressure is controlled corresponding to the difference (Step 2005). For example, when the inferred value is larger than the desired value, the pressure is increased in order to have the film thicker. In that case, the valve 36 may be opened and nitrogen gas may be supplied into the chamber 42. On the contrary, when the inferred value is smaller than the desired value, the pressure is decreased in order to have the film thinner. In that case the controller 43 may control the vacuum pump 34 to have stronger pumping force. Performing control with feeding back data, the desired relative permittivity can be obtained therefore the insulating film of high quality can be obtained.

The present invention is not limited to an embodiment as described above, however, various kinds of modifications are possible.

For example, the first heating process and the second heating process in the above embodiments may be performed in a single chamber with a single heating plate. In such case, the heating process may be performed in the processing chamber at the pressure higher than the atmospheric pressure then the pressure may be reduced to perform heating process at the pressure lower than the atmospheric pressure. In addition, conversely, the heating process for evaporating thinner and the heating process for forming a frame of the insulating film may be performed during the first heating process in separate chambers.

Furthermore, the present invention may be applied not only for a semi-conductor wafer as a substrate, but also a glass substrate used for a liquid crystal display device.

In the present invention, as an insulating film material, a pourus type material such as "pourus SiLK" series, "ALCAP" and "JSR LKD" series, which are products of Dow Chemical Company, Asahi Kasei Corporation and JSR Corporation respectively, are used in explaining the above embodiments. In addition to the above, for example, materials like CCIC manufactured by Fujitsu Limited containing porogen that evaporates by performing processing such as heating to form effervescent insulating film can be used.

As explained above, according to the present invention, an appropriate heating process can be performed at each stage of, for example, forming a molecular frame of the insulating film and performing a hardening process for the insulating film, so that the insulating film of good quality can be formed.

The disclosure of Japanese Patent Application No. 2002-145239 filed May 20, 2002 including specification, drawings and claims are herein incorporated by reference in its entirety.

Although only some exemplary embodiments of this invention have been described in details as above, those skilled in the art should readily appreciate that many modifications are possible in the exemplary embodiments without materially departing from the novel teachings and advantages of this invention. Accordingly, all such modifications are intended to be included within the scope of this invention.

What is claimed is:

1. An apparatus for forming a film, comprising:
    a coating process portion for coating an insulating film containing a porogen on a substrate;
    a first heating process portion having a first processing chamber capable of being hermetically sealed, for performing a first heating process for the substrate coated with the insulating film at a first pressure higher than an atmospheric pressure and at a first temperature, and performing a second heating process for the substrate at the first pressure and at a second temperature higher than the first temperature;
    a second heating process portion having a second processing chamber capable of being hermetically sealed, for performing a third heating process for the substrate at a second pressure lower than the atmospheric pressure on the substrate heated in the first heating process portion;
    means for measuring a film thickness of the insulating film in at least one of the first heating process portion and the second heating process portion;
    means for inferring a relative permittivity of the insulating film corresponding to a value of the measured film thickness; and
    means for controlling at least one of the first pressure and the second pressure corresponding to the inferred value of the permittivity.

2. The apparatus as set forth in claim 1, further comprising:
    a controller for controlling the first pressure to be in a range of 100 kPa to 200 kPa.

3. The apparatus as set forth in claim 1, further comprising:
    a gas supplying portion supplying a gas containing a component of an insulating film material film into the first processing chamber.

4. The apparatus as set forth in claim 1, further comprising:
    a first measuring portion measuring a concentration of the solvent evaporated in the heating process; and
    means for controlling the first heating process portion so that the first heating process is terminated and the second heating process is started after the measured concentration of the solvent reached a predetermined value.

5. The apparatus as set forth in claim 1, further comprising:
    a second measuring portion for measuring an amount of the porogen evaporated in the third heating process; and
    means for controlling the second heating process portion so that the third heating process is terminated after the measured amount of the porogen reached a predetermined value.

6. The film forming apparatus, as set forth in claim 1, further comprising:
    a heating plate provided inside the first processing chamber for placing and heating the substrate;
    a plurality of pins, capable of placing the substrate on the heating plate by moving up and down against the heating plate;
    means for controlling the plurality of pins to hold the substrate above the heating plate until a pressure inside the first processing chamber reaches the first pressure and to cause the plurality of pins to move down below the heating plate after the pressure inside the first processing chamber reaches the first pressure, so that the substrate is placed on the heating plate; and
    means for controlling the plurality of pins to hold the substrate above the heating plate until the pressure inside the first processing chamber reaches the second pressure and to cause the plurality of pins to move down below the heating plate after the pressure inside the first processing chamber reaches the second pressure, so that the substrate is placed on the heating plate.

7. The film forming apparatus, as set forth in claim 1, further comprising:
    a heating plate provided inside the second processing chamber for placing and heating the substrate;
    a plurality of pins, capable of moving up and down against the heating plate while holding the substrate and placing the substrate on the heating plate; and
    means for controlling the plurality of pins to hold the substrate above the heating plate until the pressure inside the second processing chamber reaches the second pressure and moves down below the heating plate after the pressure inside the second processing chamber reaches the second pressure, so that the substrate is placed on the heating plate.

* * * * *